(12) United States Patent
Ikeda et al.

(10) Patent No.: US 8,934,316 B2
(45) Date of Patent: Jan. 13, 2015

(54) PARALLEL-SERIAL CONVERSION CIRCUIT FOR ADJUSTING AN OUTPUT TIMING OF A SERIAL DATA SIGNAL WITH RESPECT TO A REFERENCE CLOCK SIGNAL, AND AN INTERFACE CIRCUIT, A CONTROL DEVICE INCLUDING THE SAME

(71) Applicant: Fujitsu Semiconductor Limited, Yokohama-shi, Kanagawa (JP)

(72) Inventors: Shinichiro Ikeda, Nagoya (JP); Kazumi Kojima, Ichinomiya (JP); Hiroyuki Sano, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/073,662

(22) Filed: Nov. 6, 2013

(65) Prior Publication Data

US 2014/0133252 A1    May 15, 2014

(30) Foreign Application Priority Data

Nov. 14, 2012    (JP) .................................. 2012-250188

(51) Int. Cl.
*G11C 7/22* (2006.01)
*G11C 7/10* (2006.01)

(52) U.S. Cl.
CPC .............. *G11C 7/103* (2013.01); *G11C 7/1036* (2013.01); *G11C 2207/107* (2013.01)
USPC ................. 365/219; 365/233.11; 365/233.12; 365/233.13

(58) Field of Classification Search
USPC ............... 365/219, 220, 221, 233.11, 233.12, 365/233.13, 233.1
See application file for complete search history.

(56) References Cited

U.S. PATENT DOCUMENTS

| 5,572,721 | A | 11/1996 | Rostamian |
| 6,466,505 | B1 * | 10/2002 | Landry ......................... 365/219 |
| 7,054,202 | B2 * | 5/2006 | Lee et al. ................. 365/189.05 |
| 7,864,084 | B2 | 1/2011 | Padaparambil |
| 2010/0118635 | A1 * | 5/2010 | Bae et al. ...................... 365/219 |
| 2012/0195148 | A1 * | 8/2012 | Yoko ............................. 365/219 |

FOREIGN PATENT DOCUMENTS

| JP | 08-237142 A | 9/1996 |
| JP | 2006-217488 A | 8/2006 |
| JP | 2009-260961 A1 | 11/2009 |

* cited by examiner

*Primary Examiner* — Andrew Q Tran
(74) *Attorney, Agent, or Firm* — Arent Fox LLP

(57) ABSTRACT

A parallel-serial conversion circuit includes an adjustment circuit that receives a parallel input signal having a plurality of bits and generates and outputs a parallel output signal having a plurality of bits. A conversion circuit coupled to the adjustment circuit generates a plurality of clock signals having mutually different phases with respect to a reference clock signal on the basis of the reference clock signal and serially selects the plurality of bits of the parallel output signal in accordance with the generated plurality of clock signals to convert the parallel output signal to serial 1-bit output signals. The adjustment circuit adjusts the output timing of each of the plurality of bits of the parallel output signal in time unit of half of one cycle of the reference clock signal.

8 Claims, 22 Drawing Sheets

Fig.4

| Desired Phase | Phase Adjustment | SA0, SA1, SA2, SA3 | SB0, SB1, SB2, SB3 |
|---|---|---|---|
| 45deg. ~135deg. | 45deg. ~135deg. | 0, 0, 0, 0 | 0, 0, 1, 1 |
| 135deg. ~225deg. | 135deg. ~225deg. | 0, 0, 0, 1 | 0, 1, 1, 0 |
| 225deg. ~315deg. | 225deg. ~315deg. | 0, 0, 1, 1 | 1, 1, 0, 0 |
| 315deg. ~405deg. | 315deg. ~405deg. | 0, 1, 1, 1 | 1, 0, 0, 1 |

Fig.5

| CK2a | CK2b | Selected Terminal |
|---|---|---|
| H | L | n0 |
| H | H | n1 |
| L | H | n2 |
| L | L | n3 |

Fig.12

| Desired Phase | Code | SC0 | SC1 | SC2 | SC3 |
|---|---|---|---|---|---|
| 45deg. ~135deg. | 00 | D0 | D1 | D2 | D3 |
| 135deg. ~225deg. | 01 | D3 | D0 | D1 | D2 |
| 225deg. ~315deg. | 10 | D2 | D3 | D0 | D1 |
| 315deg. ~405deg. | 11 | D1 | D2 | D3 | D0 |

Fig.13

| Desired Phase | Phase Adjustment | SA0, SA1, SA2, SA3 | SB0, SB1, SB2, SB3 |
|---|---|---|---|
| 45deg. ~135deg. | 45deg. ~135deg. | 0, 0, 0, 0 | 0, 0, 1, 1 |
| 135deg. ~225deg. | 45deg. ~135deg. | 1, 0, 0, 0 | 0, 0, 1, 1 |
| 225deg. ~315deg. | 45deg. ~135deg. | 1, 1, 0, 0 | 0, 0, 1, 1 |
| 315deg. ~405deg. | 45deg. ~135deg. | 1, 1, 1, 0 | 0, 0, 1, 1 |

Fig.20A

| Desired Phase | Code | SC0 | SC1 | SC2 | SC3 | SC4 | SC5 | SC6 | SC7 |
|---|---|---|---|---|---|---|---|---|---|
| 45deg.~90deg. | 00 | D0 | D1 | D2 | D3 | D4 | D5 | D6 | D7 |
| 90deg.~135deg. | 01 | D7 | D0 | D1 | D2 | D3 | D4 | D5 | D6 |
| 135deg.~180deg. | 10 | D6 | D7 | D0 | D1 | D2 | D3 | D4 | D5 |
| 180deg.~225deg. | 11 | D5 | D6 | D7 | D0 | D1 | D2 | D3 | D4 |

Fig.20B

| Desired Phase | SA0, SA1, SA2, SA3, SA4, SA5, SA6, SA7 | SB0, SB1, SB2, SB3, SB4, SB5, SB6, SB7 |
|---|---|---|
| 45deg.~90deg. | 0, 0, 0, 0, 0, 0, 0, 0 | 0, 0, 0, 0, 1, 1, 1, 1 |
| 90deg.~135deg. | 1, 0, 0, 0, 0, 0, 0, 0 | 0, 0, 0, 0, 1, 1, 1, 1 |
| 135deg.~180deg. | 1, 1, 0, 0, 0, 0, 0, 0 | 0, 0, 0, 0, 1, 1, 1, 1 |
| 180deg.~225deg. | 1, 1, 1, 0, 0, 0, 0, 0 | 0, 0, 0, 0, 1, 1, 1, 1 |

PARALLEL-SERIAL CONVERSION CIRCUIT FOR ADJUSTING AN OUTPUT TIMING OF A SERIAL DATA SIGNAL WITH RESPECT TO A REFERENCE CLOCK SIGNAL, AND AN INTERFACE CIRCUIT, A CONTROL DEVICE INCLUDING THE SAME

CROSS-REFERENCE TO RELATED APPLICATIONS

This application is based upon and claims the benefit of priority from prior Japanese Patent Application No. 2012-250188, filed on Nov. 14, 2012, the entire contents of which are incorporated herein by reference.

FIELD

The disclosure relates to a parallel-serial conversion circuit.

BACKGROUND

A parallel-serial conversion circuit converts a parallel data signal into a serial data signal in accordance with a single clock signal having a fixed frequency. For example, see Japanese Laid-Open Patent Publication Nos. 8-237142 and 2006-217488.

SUMMARY

For example, a control device for use with a synchronous semiconductor memory device receives a parallel data signal and outputs a serial data signal to the semiconductor memory device. In the control device, it may be necessary to adjust the output timing of a serial data signal with respect to a signal output to the semiconductor memory device (e.g., clock signal).

According to an aspect of the invention, a parallel-serial conversion circuit includes an adjustment circuit that receives a parallel input signal having a plurality of bits and generates and outputs a parallel output signal having a plurality of bits. A conversion circuit coupled to the adjustment circuit generates a plurality of clock signals having mutually different phases with respect to a reference clock signal on the basis of the reference clock signal. The conversion circuit serially selects the plurality of bits of the parallel output signal in accordance with the generated plurality of clock signals to convert the parallel output signal to serial 1-bit output signals. The adjustment circuit adjusts the output timing of each of the plurality of bits of the parallel output signal in time unit of half of one cycle of the reference clock signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF DRAWINGS

FIGS. 4 and 5 illustrate the operation of a control code generation circuit of the first embodiment;

FIGS. 12 and 13 illustrate the operation of a control code generation circuit of the second embodiment;

FIGS. 20A and 20B illustrate the operation of a control code generation circuit.

DESCRIPTION OF EMBODIMENTS

First Embodiment

Figure 1:
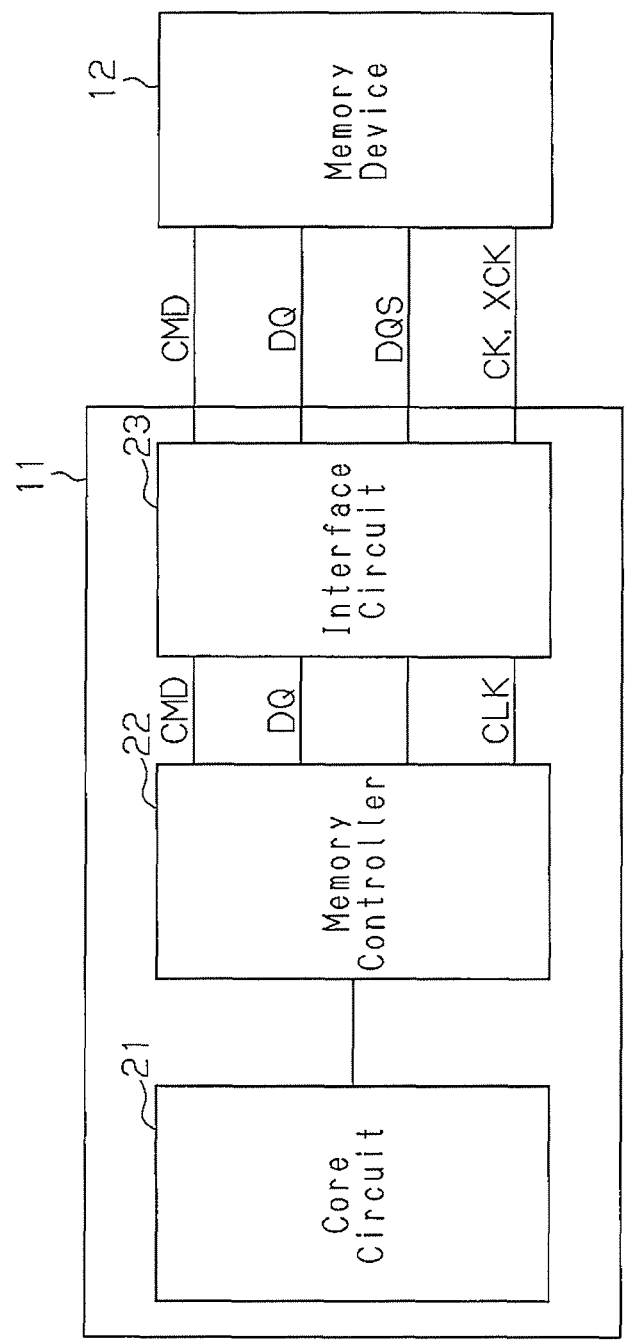
FIG. 1 is a schematic block diagram of a system according to a first embodiment.

A first embodiment will be described. FIG. 1 illustrates a system including a control device 11 and a memory device 12 accessed by the control device 11. The control device 11 is, for example, a single chip (semiconductor integrated circuit device: LSI). The memory device 12 is a synchronous semiconductor memory device, for example, a double data rate 3 synchronous dynamic random access memory (DDR3-SDRAM).

The control device 11 includes a core circuit 21, a memory controller 22 and an interface circuit 23. The core circuit 21 is, for example, a central processing unit (CPU). The core circuit 21 provides, to the memory controller 22, a read request for reading from the memory device 12 a data set according to a process to be executed, and an address of designating a read-out position of the data set. The core circuit 21 provides, to the memory controller 22, a write request for writing a data set in the memory device 12, and an address of designating a storage position of the data set.

The memory controller 22 outputs an internal clock signal CLK of the memory controller 22 to the interface circuit 23. The interface circuit 23 operates in accordance with the internal clock signal CLK. The interface circuit 23 outputs complementary clock signals CK and XCK for transmitting data.

The memory controller 22 accesses the memory device 12 via the interface circuit 23 in respond to a request from the core circuit 21. For example, in a case where the memory controller 22 receives a write request from the core circuit 21, the memory controller 22 outputs a command CMD (write command), an address, and a data signal DQ, and the interface circuit 23 outputs the command CMD, the address, the data strobe signal DQS, and the data signal DQ. The memory device 12 receives the data signal DQ on the basis of the clock signals CK and XCK, and the data strobe signal DQS, to store the data signal DQ in a region according to the address on the basis of the command CMD.

In a case where the memory controller 22 receives a read request from the core circuit 21, the memory controller 22 provides a command CMD (read command) and an address to the memory device 12 via the interface circuit 23. The memory device 12 responds the read command, outputs a data strobe signal (strobe signal) DQS, and readouts a data signal DQ from a region according to the address in synchronization with the transition timing of the data strobe signal DQS to output the same. The interface circuit 23 receives the data signal DQ on the basis of the data strobe signal DQS and outputs the data signal DQ. The memory controller 22 receives the data signal DQ and outputs a data signal corresponding to the data signal DQ.

The memory controller 22 executes training operation for adjusting the output timing of the data strobe signal DQS and the data signal DQ, at predetermined timing. The predetermined timing may be a period during which the core circuit 21 does not access the memory device 12, such that when an initial process is executed after power is supplied, and after a constant period from the input of a power-on-reset signal, for example.

The memory device 12 outputs a clock skew between the internal clock signal CLK and the data strobe signal DQS in the interface circuit 23. The memory controller 22 adjusts the timing when the data strobe signal DQS, the data signal DQ, the command CMD, the clock signals CK and XCK output from the interface circuit 23 reach the memory device 12, on the basis of the clock skew. For example, the memory controller 22 outputs, to the interface circuit 23, phase information generated on the basis of the clock skew. The interface circuit 23 outputs the data strobe signal DQS and the data signal DQ at the timing according to the phase information. The memory controller 22 outputs, to the interface circuit 23, phase information that is set on the basis of the clock skew of the memory device 12 such that the data strobe signal DQS, the data signal DQ, the command CMD, and the clock signals CK and XCK simultaneously reach the memory device 12. The interface circuit 23 outputs the data strobe signal DQS and the data signal DQ at the timing according to the phase information.

Figure 2:
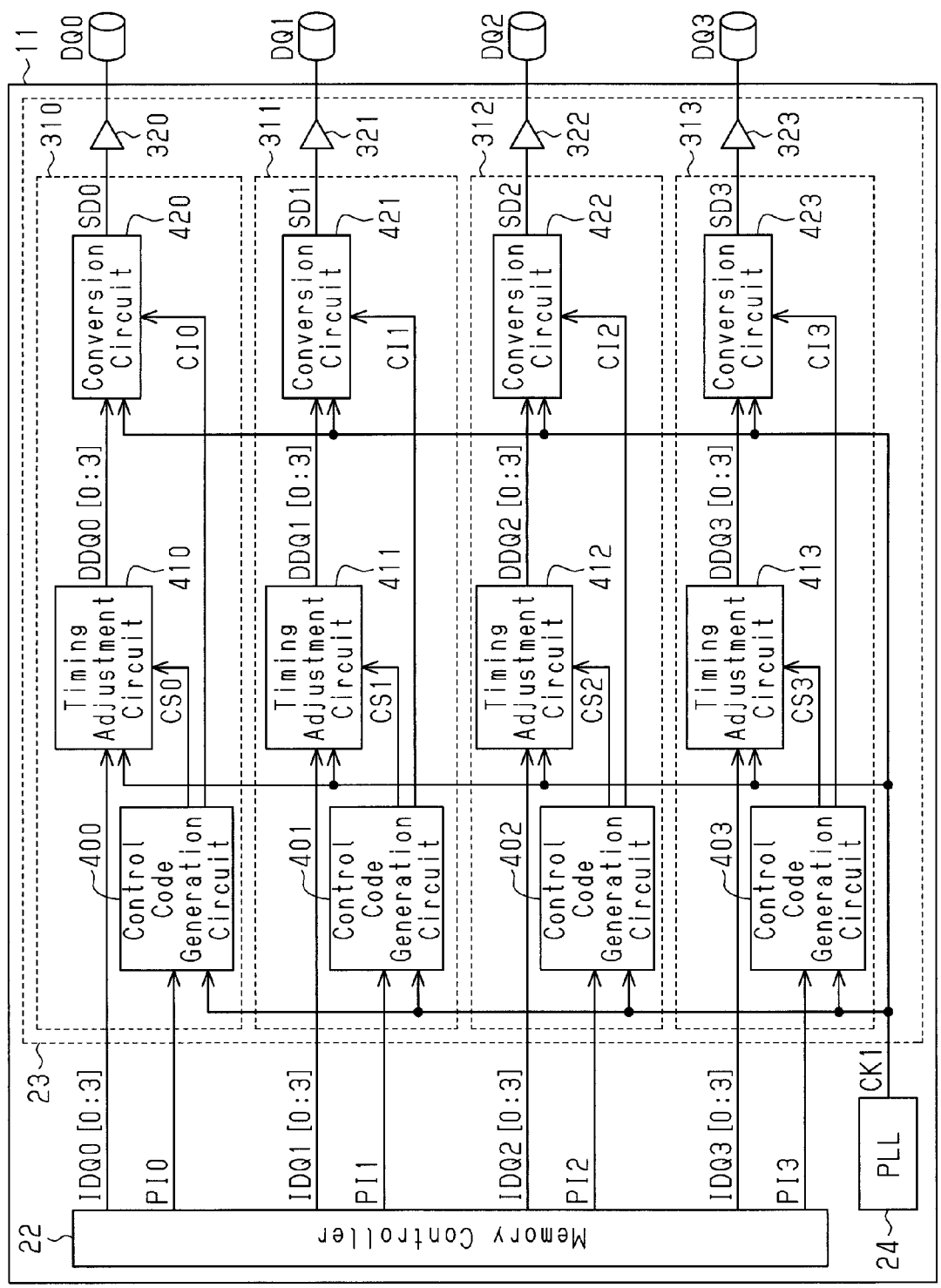
FIG. 2 is a schematic block diagram of an interface circuit of the first embodiment.

As illustrated in FIG. 2, the memory controller 22 outputs a plurality of data signals IDQ0 [0:3] to IDQ3 [0:3]. In FIG. 2, in a case where data signals DQ between the memory controller 22 and the interface circuit 23 needs to be distinguished from data signals DQ output from the interface circuit 23, a reference sign IDQ is assigned to a data signal between the memory controller 22 and the interface circuit 23. The [0:3] denotes the bit of the data signal. Each of the data signals IDQ0 [0:3] to IDQ3 [0:3] is a parallel data signal having 4 bits. The interface circuit 23 converts the 4-bit data signal IDQ0 [0:3] into serial four 1-bit data signals DQ0. Similarly, the interface circuit 23 converts the remaining data signals IDQ1 [0:3] to IDQ3 [0:3] into data signals DQ1 to DQ3, respectively.

The interface circuit 23 includes four parallel-serial conversion circuits 310 to 313 corresponding to the data signals IDQ0 [0:3] to IDQ3 [0:3] respectively, and four output buffers 320 to 323.

The parallel-serial conversion circuit 310 converts 4-bit data signal IDQ0 [0:3] into serial four 1-bit data signals SD0. The output buffer 320 outputs the data signals DQ0 on the basis of the data signals SD0. Similarly, the parallel-serial conversion circuits 311 to 313 converts the data signals IDQ1 to IDQ3 into data signals SD1 to SD3, respectively. The output buffers 321 to 323 output the data signals DQ1 to DQ3 on the basis of the data signals SD1 to SD3.

The parallel-serial conversion circuit 310 includes a control code generation circuit 400, a timing adjustment circuit 410, and a conversion circuit 420. The control code generation circuit 400, the timing adjustment circuit 410, and the conversion circuit 420 operate in accordance with a clock signal CK1 generated by a phase locked loop circuit (PLL circuit) 24. The frequency of the clock signal CK1 is equal to the frequency of the internal clock signal CLK output from the memory controller 22. The memory controller 22 outputs the data signals IDQ0 [0:3] to IDQ3 [0:3] in synchronization with the internal clock signal CLK. The parallel-serial conversion circuit 310 converts the data signal IDQ0 [0:3] into the data signals SD0 in synchronization with the clock signal CK1.

The control code generation circuit 400 generates a control signal CS0 for the timing adjustment circuit 410, and a control signal CI0 for the conversion circuit 420, on the basis of phase information PI0. The control code generation circuit 400 is an example of a control circuit.

The timing adjustment circuit 410 controls delay time with respect to each bit data of the data signal IDQ0 [0:3] by unit of half (T/2) of one cycle (T) of the clock signal CK1, in accordance with the control signal CS0. Then, the timing adjustment circuit 410 outputs a delay data signal DDQ0 [0:3] formed by delaying each bit data of the data signal IDQ0 [0:3] depending on the controlled delay time.

The conversion circuit 420 generates a plurality of clock signals formed by adjusting phases with respect to the clock signal CK1, in accordance with the control signal CI0. The phase difference between the clock signal CK1 serving as a reference and each of the plurality of clock signals that are generated corresponds to the aforementioned phase information PI0. The conversion circuit 420 operates in accordance with the generated plurality of clock signals, converts the 4-bit delay data signal DDQ0 [0:3] output from the timing adjustment circuit 410 into serial four 1-bit data signals SD0, and serially outputs the data signals SD0. That is, the conversion circuit 420 performs parallel-serial conversion and phase control.

Similarly, the parallel-serial conversion circuit 311 includes a control code generation circuit 401, a timing adjustment circuit 411, and a conversion circuit 421. The control code generation circuit 401 generates a control signal CS1 for the timing adjustment circuit 411, and a control signal CI1 for the conversion circuit 421, on the basis of phase information PI1. The timing adjustment circuit 411 outputs a delay data signal DDQ1 [0:3] according to the data signal IDQ1 [0:3] in accordance with the control signal CS1. The conversion circuit 421 operates in accordance with the control signal CI1, and a plurality of clock signals formed by adjusting phases with respect to the clock signal CK1, and converts the delay data signal DDQ1 [0:3] output from the timing adjustment circuit 411 into serial 1-bit data signals SD1.

The parallel-serial conversion circuit 312 includes a control code generation circuit 402, a timing adjustment circuit 412, and a conversion circuit 422. The control code generation circuit 402 generates a control signal CS2 for the timing adjustment circuit 412, and a control signal CI2 for the conversion circuit 422, on the basis of phase information PI2. The timing adjustment circuit 412 outputs a delay data signal DDQ2 [0:3] according to the data signal IDQ2 [0:3] in accordance with the control signal CS2. The conversion circuit 422 converts the delay data signal DDQ2 [0:3] output from the timing adjustment circuit 412 into serial 1-bit data signals SD2, on the basis of a plurality of clock signals formed by adjusting phases with respect to the clock signal CK1, in accordance with the control signal CI2.

The parallel-serial conversion circuit 313 includes a control code generation circuit 403, a timing adjustment circuit 413, and a conversion circuit 423. The control code generation circuit 403 generates a control signal CS3 for the timing adjustment circuit 413, and a control signal CI3 for the conversion circuit 423, on the basis of phase information PI3. The timing adjustment circuit 413 outputs a delay data signal DDQ3 [0:3] according to the data signal IDQ3 [0:3] in accordance with the control signal CS3. The conversion circuit 423 converts the delay data signal DDQ3 [0:3] output from the timing adjustment circuit 413 into serial 1-bit data signals SD3, on the basis of a plurality of clock signals formed by adjusting phases with respect to the clock signal CK1, in accordance with the control signal CI3.

The timing adjustment circuit 410, the conversion circuit 420, and the control code generation circuit 400 included in the parallel-serial conversion circuit 310 will be described. The parallel-serial conversion circuits 311 to 313 are similar to the parallel-serial conversion circuit 310, and therefore explanation and illustration thereof may be omitted.

Figure 3:
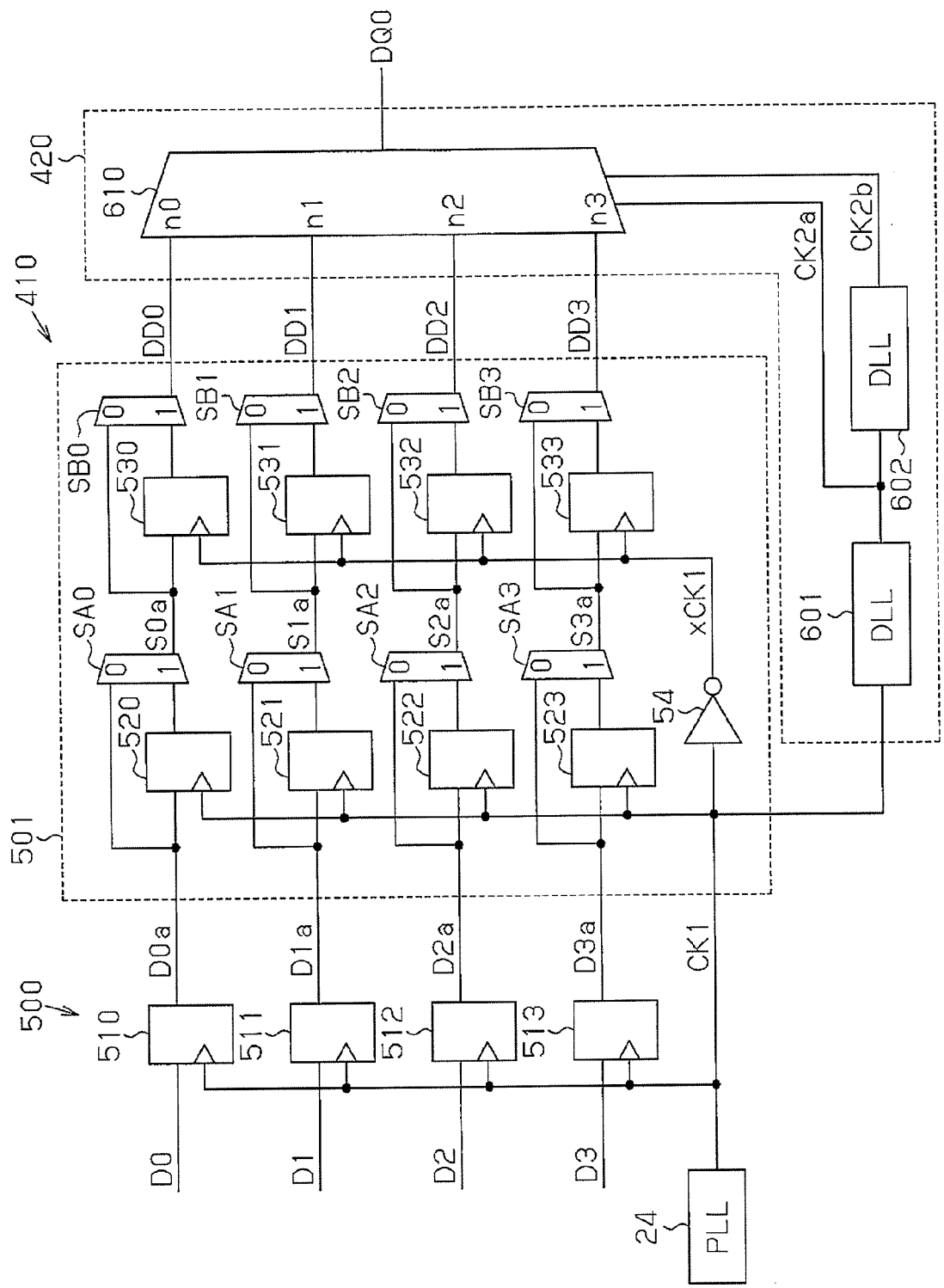
FIG. 3 is a circuit diagram of the interface circuit of the first embodiment.

As illustrated in FIG. 3, the timing adjustment circuit 410 includes a latch circuit 500, and a delay adjustment circuit 501. The 4-bit data signal IDQ0 [0:3] illustrated in FIG. 2 includes four 1-bit data signals D0 to D3 illustrated in FIG. 3. That is, a 1-bit data signal IDQ0 [0] corresponds to the data signal D0, and data signals IDQ0 [1] to IDQ0 [3] correspond to the data signals D1 to D3, respectively. The 4-bit delay data signal DDQ0 [0:3] illustrated in FIG. 2 includes four 1-bit delay data signals DD0 to DD3 illustrated in FIG. 3. That is, 1-bit delay data signal DDQ0 [0] corresponds to the delay data signal DD0, and the remaining delay data signals DDQ0 [1] to DDQ0 [3] correspond to the delay data signals DD1 to DD3, respectively.

The latch circuit 500 includes four flip-flop circuits 510 to 513 corresponding to the data signals D0 to D3 respectively. The flip-flop circuits 510 to 513 have input terminals (data terminals) to which the data signals D0 to D3 are provided respectively. Each of the flip-flop circuits 510 to 513 has a clock terminal to which the clock signal CK1 is provided. The flip-flop circuits 510 to 513 latch, for example, the data signals D0 to D3 in response to the H level clock signal CK1, to output data signals D0a to D3a whose levels are equal to the latched levels, respectively.

The delay adjustment circuit 501 includes flip-flop circuits 520 to 523 and 530 to 533, selection circuits SA0 to SA3 and SB0 to SB3, and an inverter circuit 54.

The control signal CS0 output from the control code generation circuit 400, illustrated in FIG. 2 includes control signals provided to the selection circuits SA0 to SA3 and SB0 to SB3. In the following description, a plurality of respective control signals provided to the selection circuits SA0 to SA3 and SB0 to SB3 are sometimes denoted by the same reference signs identical with the reference signs of the corresponding selection circuits. For example, a control signal SA0 indicates a control signal for the selection circuit SA0.

The inverter circuit 54 outputs an inverted clock signal xCK1 whose level is the level of the clock signal CK1 that is logically inverted. The clock signal CK1 is provided to the clock terminals of the flip-flop circuits 520 to 523. The inverted clock signal xCK1 is provided to the clock terminals of the flip-flop circuits 530 to 533.

The data signals D0a to D3a are provided to the respective data terminals of the flip-flop circuits 520 to 523, and the respective first terminals of the selection circuits SA0 to SA3. The flip-flop circuits 520 to 523 latch, for example, the data signals D0a to D3a in response to the H level clock signal CK1, to output signals whose levels are equal to the latched levels. The respective output signals from the flip-flop circuits 520 to 523 are provided to the second terminals of the selection circuits SA0 to SA3. The selection circuits SA0 to SA3 select the first terminals or the second terminals according to the control signals SA0 to SA3, respectively. The selection circuits SA0 to SA3 select, for example, the first terminals in response to the L level (logical value "0") control signals SA0 to SA3, to select the second terminals in response to the H level (logical value "1") control signals SA0 to SA3, respectively. The selection circuits SA0 to SA3 output signals S0a to S3a which are equal to signals provided to the selected terminals, respectively.

The output signal S0a to S3a from the selection circuits SA0 to SA3 are provided to the respective data terminals of the flip-flop circuits 530 to 533, and the respective first terminals of the selection circuits SB0 to SB3. The flip-flop circuits 530 to 533 latch, for example, the data signals S0a to S3a in response to the H level inverted clock signal xCK1, to output signals whose levels are equal to the latched levels. The respective output signals from the flip-flop circuits 530 to 533 are provided to the second terminals of the selection circuits SB0 to SB3. The selection circuits SB0 to SB3 select the first terminals or the second terminals according to the control signals SB0 to SB3, respectively. The selection circuits SB0 to SB3 select, for example, the first terminals in response to the L level (logical value "0") control signals SB0 to SB3, to select the second terminals in response to the H level (logical value "1") control signals SB0 to SB3, respectively. The selection circuits SB0 to SB3 output signals DD0 to DD3 which are equal to signals provided to the selected terminals, respectively.

The conversion circuit 420 includes two delay locked loop circuits (DLL circuits) 601 and 602, and a selection circuit 610. The clock signal CK1 and the control signal CI0 are provided to the delay locked loop circuit 601. The delay locked loop circuit 601 generates a clock signal CK2a formed by delaying the clock signal CK1 according to the control signal CI0. Accordingly, the cycle of the clock signal CK2a is equal to the cycle of the clock signal CK1. The delay locked loop circuit 601 controls the phase difference of the clock signal CK2a with respect to the clock signal CK1, according to the control signal CI0. The delay locked loop circuit 601 is capable of controlling the clock signal CK2a with respect to the clock signal CK1 in a predetermined range (e.g., 45 deg. to 405 deg.).

The clock signal CK2a is provided to the delay locked loop circuit 602 and the selection circuit 610. The delay locked loop circuit 602 delays the clock signal CK2a to generate a clock signal CK2b. Accordingly, the cycle of the clock signal CK2b is equal to the cycle of the clock signal CK2a. The phase difference of the clock signal CK2b with respect to the clock signal CK2a is a predetermined phase difference (e.g., 90 deg.). The clock signal CK2b is provided to the selection circuit 610.

The selection circuit 610 includes four input terminals n0 to n3. The signals DD0 to DD3 are provided to the input terminals n0 to n3, respectively. As illustrated in FIG. 5, the selection circuit 610 selects one of the four input terminals n0 to n3 in accordance with the logical levels of the clock signals CK2a and CK2b. The selection circuit 610 outputs a signal equal to a signal provided to the selected one terminal, namely, the 1-bit data signal SD0.

The operation of the aforementioned parallel-serial conversion circuit 310 will be described.

As illustrated in FIG. 3, the flip-flop circuits 510 to 513 in the latch circuit 500 latch the data signals D0 to D3 in response to the clock signal CK1, to output the signals D0a to D3a whose levels are equal to the latched levels, respectively. Then, the flip-flop circuits 520 to 523 of the delay adjustment circuit 501 latch the data signals D0a to D3a in response to the clock signal CK1, to output the respective signals whose levels are equal to the latched levels. Accordingly, the flip-flop circuits 520 to 523 output the respective signals by one cycle of the clock signal CK1 with respect to the data signals D0a to D3a. The selection circuits SA0 to SA3 output the signals S0a to S3a equal to the signals provided to the respective first terminals in response to the control signals whose logical values are "0", respectively, and output the signals S0a to S3a equal to the signals provided to the respective second terminals in response to the control signals whose logical values are "1", respectively.

The flip-flop circuits 530 to 533 of the delay adjustment circuit 501 latch the signals S0a to S3a in response to the inverted clock signal xCK1, to output signals whose levels are equal to the latched levels, respectively. Accordingly, the flip-flop circuits 530 to 533 output the respective signals with delay by half of one cycle of the clock signal CK1 with respect to the signals S0a to S3a. The selection circuits SB0 to SB3 output the signals DD0 to DD3 equal to the signals provided to the respective first terminals in response to the control signals whose logical values are "0", respectively, and output the signals DD0 to DD3 equal to the signals provided to the respective second terminals in response to the control signals whose logical values are "1", respectively.

As described above, the control code generation circuit 400 illustrated in FIG. 2 generates the control signal CS0 (control signals SA0 to SA3 and SB0 to SB3) for the selection circuits SA0 to SA3 and SB0 to SB3 illustrated in FIG. 3, according to the phase information PI0. The control signal CS0 corresponds to the phase difference with respect to the clock signal CK1. The control code generation circuit 400 generates the control signal CI0 for the delay locked loop circuit 601 illustrated in FIG. 3, according to the phase information PI0.

FIG. 5 illustrates an example of the phase adjustment ranges in the delay locked loop circuit 601, and the logical values of the control signals for the selection circuits SA0 to SA3 and SB0 to SB3, with respect to desired phases.

For example, in a case where a desired phase with respect to the data signals SD0 (DQ0) is "45 deg. to 135 deg.", the phase adjustment range in the delay locked loop circuit 601 is "45 deg. to 135 deg." The logical values of the control signals for the selection circuits SA0 to SA3, and for the selection circuits SB0 to SB3 are "0, 0, 0, 0" and "0, 0, 1, 1", respectively.

Figure 6:
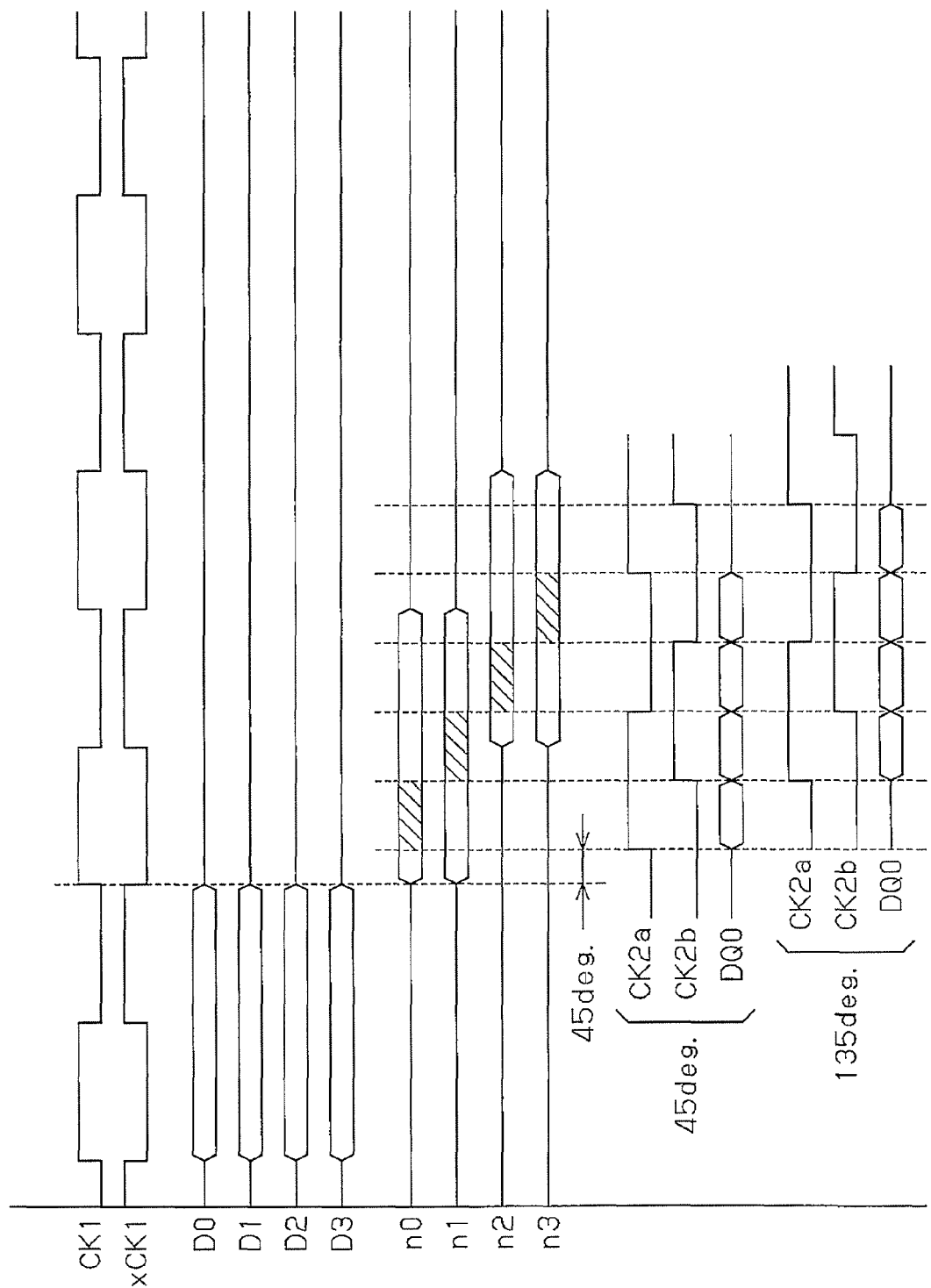
FIGS. 6 to 9 are timing diagrams for illustrating the operation of the interface circuit of the first embodiment.

The selection circuit SA0 outputs a signal that bypasses the flip-flop circuit 520, namely, a signal S0a whose timing is equal to the timing of the data signal D0a, in response to the control signal whose logical value is "0". The selection circuit SB0 outputs the signal DD0 at timing equal to the timing of the signal that bypasses the flip-flop circuit 520, namely, the data signal S0a, in response to the control signal whose logical value is "0". Consequently, as illustrated in FIG. 6, the data signal D0 is provided to the terminal n0 of the selection circuit 610 at a phase difference of 0 deg. with respect to the clock signal CK1.

The selection circuit SA1 outputs a signal that bypasses the flip-flop circuit 521, namely, a signal S1a whose timing is equal to the timing of the data signal D1a, in response to the control signal whose logical value is "0". The selection circuit SB1 outputs the signal DD1 at timing equal to the timing of the signal that bypasses the flip-flop circuit 521, namely, the data signal S1a, in response to the control signal whose logical value is "0". Consequently, as illustrated in FIG. 6, the data signal D1 is provided to the terminal n1 of the selection circuit 610 at a phase difference of 0 deg. with respect to the clock signal CK1.

The selection circuit SA2 outputs a signal that bypasses the flip-flop circuit 522, namely, a signal S2a whose timing is equal to the timing of the data signal D2a, in response to the control signal whose logical value is "0". The selection circuit SB2 outputs the signal DD2 at the timing of delaying by half of one cycle of the clock signal CK1 with respect to the signal that is latched by the flip-flop circuit 522, namely, the signal S2a, in response to the control signal whose logical value is "1". Consequently, as illustrated in FIG. 6, the data signal D2 is provided to the terminal n2 of the selection circuit 610 at a phase difference of 180 deg. with respect to the clock signal CK1.

The selection circuit SA3 outputs a signal that bypasses the flip-flop circuit 523, namely, a signal S3a whose timing is equal to the timing of the data signal D3a, in response to the control signal whose logical value is "0". The selection circuit SB3 outputs the signal DD3 at the timing of delaying by half of one cycle of the clock signal CK1 with respect to the signal that is latched by the flip-flop circuit 523, namely, the signal S3a, in response to the control signal whose logical value is "1". Consequently, as illustrated in FIG. 6, the data signal D3 is provided to the terminal n3 of the selection circuit 610 at a phase difference of 180 deg. with respect to the clock signal CK1.

In FIG. 6, hatching portions in the respective signals provided to the terminals n0 to n3 denote periods selected by the logical levels of the clock signals CK2a and CK2b, in a case where the phase difference between the clock signal CK1 and the clock signal CK2a is 45 deg. For example, during the periods of the H level clock signal CK2a and the L level clock signal CK2b, the terminal n0 of the selection circuit 610 illustrated in FIG. 3 is selected, and the signal provided to the terminal n0, namely, the data signal D0 is output as the data signal SD0 (DQ0). During the period of the H level clock signal CK2a and the H level clock signal CK2b, the terminal n1 of the selection circuit 610 illustrated in FIG. 3 is selected, and the signal provided to the terminal n1, namely, the data signal D1 is output as the data signal SD0 (DQ0). During the period of the L level clock signal CK2a and the H level clock signal CK2b, the terminal n2 of the selection circuit 610 illustrated in FIG. 3 is selected, and the signal provided to the terminal n2, namely, the data signal D2 is output as the data signal SD0 (DQ0). During the period of the L level clock signal CK2a and the L level clock signal CK2b, the terminal n3 of the selection circuit 610 illustrated in FIG. 3 is selected, and the signal provided to the terminal n3, namely, the data signal D3 is output as the data signal SD0 (DQ0).

As illustrated in FIG. 4, in a case where the desired phase with respect to the data signals SD0 (DQ0) is "135 deg. to 225 deg.", the phase adjustment range in the delay locked loop circuit 601 is "135 deg. to 225 deg." The logical values of the control signals for the selection circuits SA0 to SA3, and the logical values of the control signals for the selection circuits SB0 to SB3 are "0, 0, 0, 1" and "0, 1, 1, 0", respectively.

Figure 7:
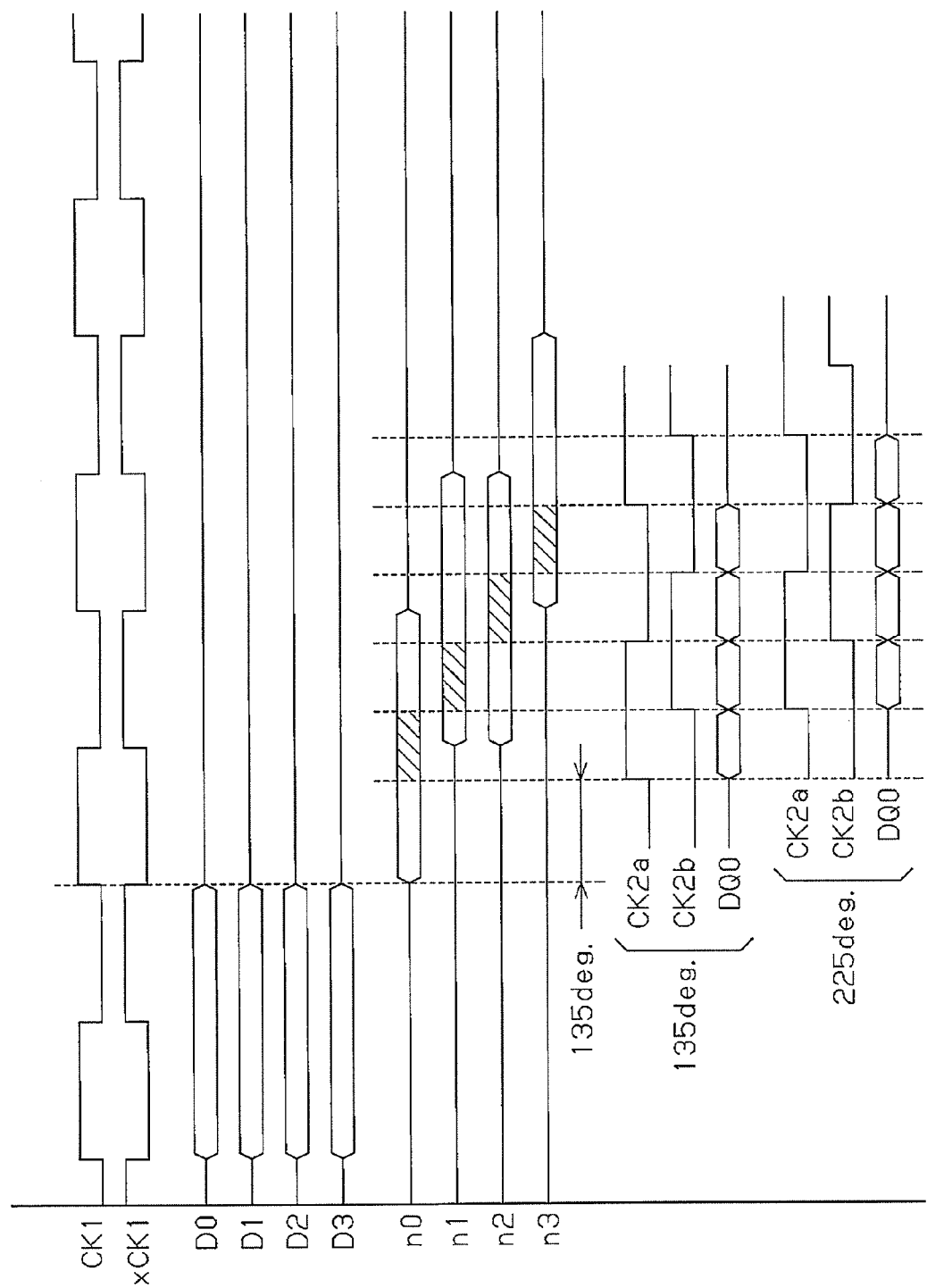

As illustrated in FIG. 7, the data signal D0 is provided to the terminal n0 of the selection circuit 610 at a phase difference of 0 deg. with respect to the clock signal CK1. The data signal D1 is provided to the terminal n1 of the selection circuit 610 at a phase difference of 180 deg. with respect to the clock signal CK1. The data signal D2 is provided to the terminal n2 of the selection circuit 610 at a phase difference of 180 deg. with respect to the clock signal CK1. The data signal D3 is provided to the terminal n3 of the selection circuit 610 at a phase difference of 270 deg. with respect to the clock signal CK1.

In FIG. 7, hatching portions in the respective signals provided to the terminals n0 to n3 denote periods selected by the logical levels of the clock signals CK2a and CK2b, in a case where the phase difference between the clock signal CK1 and the clock signal CK2a is 135 deg. Similarly to the case illustrated in FIG. 6, the terminals n0, n1, n2 and n3 are serially selected in accordance with the logical levels of the clock signal CK2a and the clock signal CK2b. Then, the data signals D0, D1, D2 and D3 provided to the terminals n0, n1, n2 and n3 respectively are output as the data signals SD0 (DQ0).

As illustrated in FIG. 4, in a case where the desired phase with respect to the data signals SD0 (DQ0) is "225 deg. to 315 deg.", the phase adjustment range in the delay locked loop circuit 601 is "225 deg. to 315 deg." The logical values of the control signals for the selection circuits SA0 to SA3, and the logical values of the control signals for the selection circuits SB0 to SB3 are "0, 0, 1, 1" and "1, 1, 0, 0", respectively.

Figure 8:
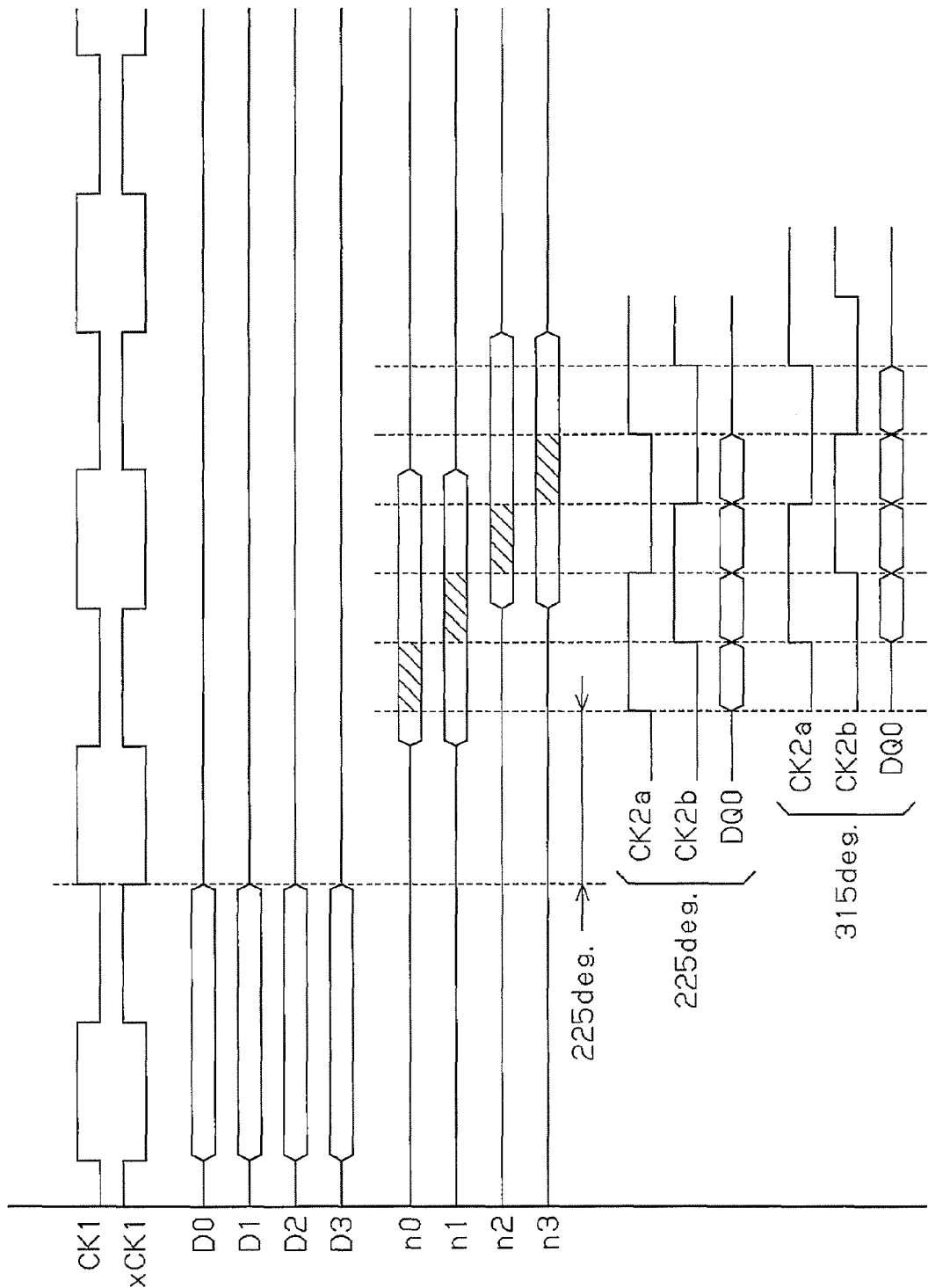

As illustrated in FIG. 8, the data signal D0 is provided to the terminal n0 of the selection circuit 610 at a phase difference of 180 deg. with respect to the clock signal CK1. The data signal D1 is provided to the terminal n1 of the selection circuit 610 at a phase difference of 180 deg. with respect to the clock signal CK1. The data signal D2 is provided to the terminal n2 of the selection circuit 610 at a phase difference of 270 deg. with respect to the clock signal CK1. The data signal D3 is provided to the terminal n3 of the selection circuit 610 at a phase difference of 270 deg. with respect to the clock signal CK1.

In FIG. 8, hatching portions in the respective signals provided to the terminals n0 to n3 denote periods selected by the logical levels of the clock signals CK2a and CK2b, in a case where the phase difference between the clock signal CK1 and the clock signal CK2a is 225 deg. Similarly to the cases illustrated in FIG. 6 and FIG. 7, the terminals n0, n1, n2 and n3 are serially selected in accordance with the logical levels of the clock signal CK2a and the clock signal CK2b. Then, the data signals D0, D1, D2 and D3 provided to the terminals n0, n1, n2 and n3 respectively are output as the data signals SD0 (DQ0).

As illustrated in FIG. 4, in a case where the desired phase with respect to the data signals SD0 (DQ0) is "315 deg. to 405 deg.", the phase adjustment range in the delay locked loop circuit 601 is "315 deg. to 405 deg." The logical values of the control signals for the selection circuits SA0 to SA3, and the logical values of the control signals for the selection circuits SB0 to SB3 are "0, 1, 1, 1" and "1, 0, 0, 1", respectively.

Figure 9:
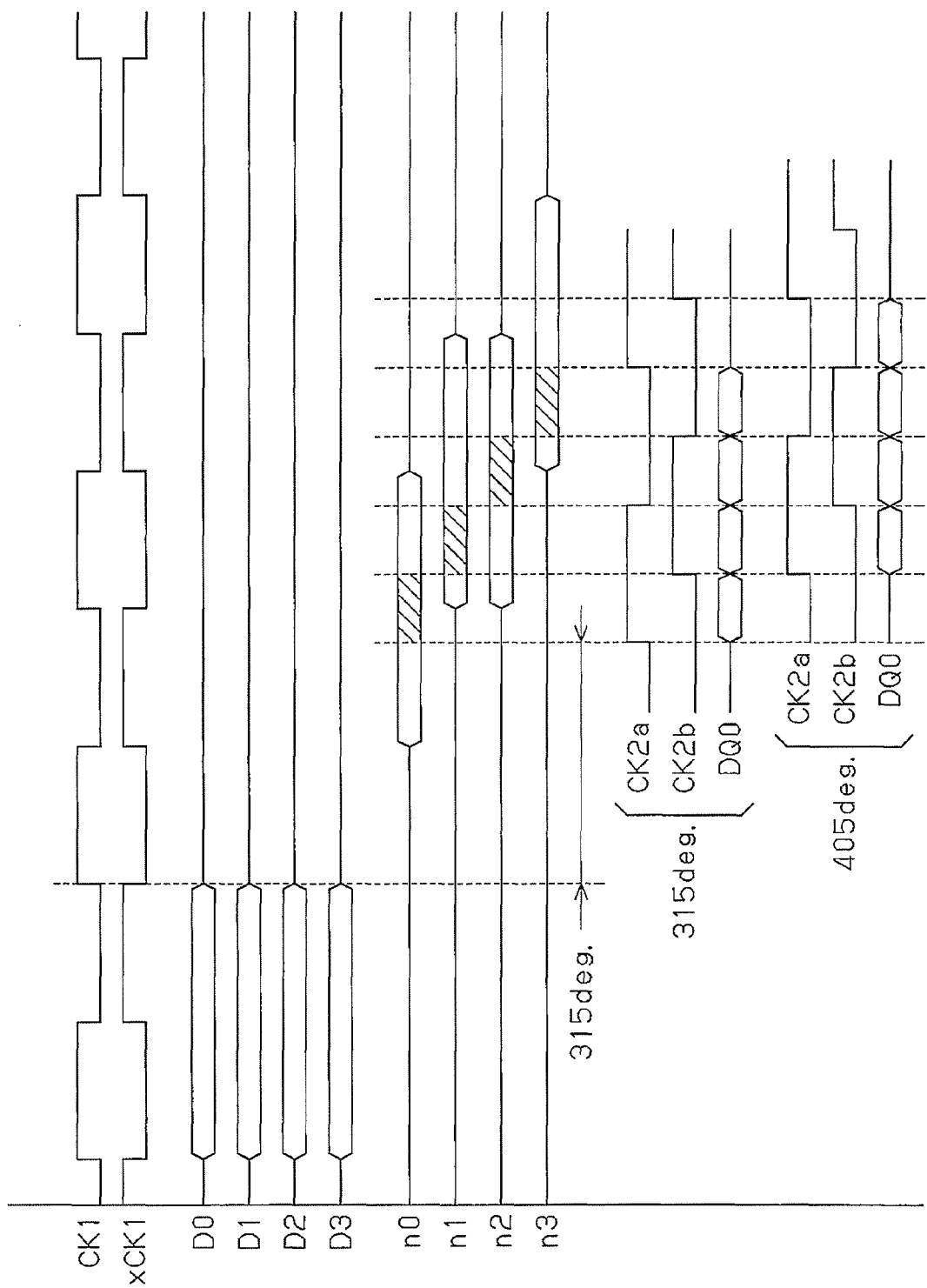

As illustrated in FIG. 9, the data signal D0 is provided to the terminal n0 of the selection circuit 610 at a phase difference of 180 deg. with respect to the clock signal CK1. The data signal D1 is provided to the terminal n1 of the selection circuit 610 at a phase difference of 270 deg. with respect to the clock signal CK1. The data signal D2 is provided to the terminal n2 of the selection circuit 610 at a phase difference of 270 deg. with respect to the clock signal CK1. The data signal D3 is provided to the terminal n3 of the selection circuit 610 at a phase difference of 360 deg. with respect to the clock signal CK1.

In FIG. 9, hatching portions in the respective signals provided to the terminals n0 to n3 denote periods selected by the logical levels of the clock signals CK2a and CK2b, in a case where the phase difference between the clock signal CK1 and the clock signal CK2a is 315 deg. Similarly to the cases illustrated in FIG. 6 to FIG. 8, the terminals n0, n1, n2 and n3 are serially selected in accordance with the logical levels of the clock signal CK2a and the clock signal CK2b. Then, the data signals D0, D1, D2 and D3 provided to the terminals n0, n1, n2 and n3 respectively are output as the data signals SD0 (DQ0).

As described above, according to the first embodiment, the following effects are produced.

(1-1) The parallel-serial conversion circuit 310 includes the control code generation circuit 400, the timing adjustment circuit 410, and the conversion circuit 420. The control code generation circuit 400 generates the control signal CS0 for the timing adjustment circuit 410, and the control signal CI0 for the conversion circuit 420 on the basis of the phase information PI0. The timing adjustment circuit 410 controls delay time with respect to each bit data of the data signal IDQ0 [0:3] by unit of half (T/2) of one cycle of the clock signal CK1, in accordance with the control signal CS0. Then, the timing adjustment circuit 410 outputs the delay data signal DDQ0 [0:3] formed by delaying each bit data of the data signal IDQ0 [0:3] depending on the controlled delay time. The conversion circuit 420 generates a plurality of clock signals formed by adjusting phases with respect to the clock signal CK1, in accordance with the control signal CI0. Then, the conversion circuit 420 converts the 4-bit delay data signal DDQ0 [0:3] output from the timing adjustment circuit 410 into a plurality of 1-bit data signals SD0, on the basis of the generated plurality of clock signals. The conversion circuit 420 performs parallel-serial conversion and phase control. Accordingly, the plurality of 1-bit data signals SD0 generated by the conversion may be serially output at timing according to the phase information PI0.

(1-2) The flip-flop circuits 520 to 523 of the delay adjustment circuit 501 latch the data signals D0a to D3a in response to the clock signal CK1 respectively, to output the respective signals whose levels are equal to the latched levels. The selection circuits SA0 to SA3 select the data signals D0a to D3a provided to the flip-flop circuits 520 to 523, or select the output signals of the flip-flop circuits 520 to 523, in response to the control signals, to output the signals S0a to S3a equal to the selected signals, respectively.

The flip-flop circuits 530 to 533 latch the output signals S0a to S3a of the selection circuits SB0 to SB3 in response to the inverted clock signal xCK1 formed by inverting the clock signal CK1 by the inverter circuit 54, to output signals whose levels are equal to the latched levels. The selection circuits SB0 to SB3 select the select the data signals S0a to S3a provided to the flip-flop circuits 530 to 533, or select the output signals of the flip-flop circuits 530 to 533, in response to the control signals, to output the signals DD0 to DD3 equal to the selected signals, respectively.

The phase of the inverted clock signal xCK1 delays by ½ of the cycle of the clock signal CK1 with respect to the clock signal CK1. Accordingly, the timing when each of the flip-flop circuits 530 to 533 latches a signal delays by ½ cycle of each of the clock signals CK1 and xCK1 with respect to the timing when each of the flip-flop circuits 520 to 523 latches a signal. Therefore, it is possible to easily generate a signal that delays by ½ unit of one cycle of each of the clock signals CK1 and xCK1 with respect to the data signals D0a to D3a.

(1-3) The delay locked loop circuit 601 of the conversion circuit 420 generates the clock signal CK2a formed by delaying the clock signal CK1 according to the control signal CI0. The delay locked loop circuit 602 delays the clock signal CK2a, to generate the clock signal CK2b at a predetermined phase difference (e.g., 90 deg.) with respect to the clock signal CK2a. The selection circuit 610 includes the four input terminals n0 to n3. The signals DD0 to DD3 are provided to the input terminals n0 to n3, respectively. The selection circuit 610 selects one of the four input terminals n0 to n3 in accordance with the logical levels of the clock signals CK2a and CK2b, to output a signal equal to the signal provided to the selected terminal, namely, the 1-bit data signal SD0.

Thus, the signals DD0 to DD3 selected by combination of the logical levels of the clock signals CK2a and CK2b having the a predetermined phase difference, namely, the data signals D0 to D3 are serially output as the data signals SD0. Therefore, a clock signal with a higher frequency than the clock signal CK1 (CK2a, CK2b) is not required, and parallel-serial conversion is possible. Additionally, the phases of the clock signals CK2a and CK2b with respect to the clock signal CK1 serving as a reference are adjusted, so that the output timing of the data signals SD0 may be easily adjusted.

Second Embodiment

The difference of a second embodiment from the first embodiment will be mainly described. The same components as those of the first embodiment are denoted by the same reference numerals, and explanation and illustration of all or a part of these may be omitted.

Figure 10:
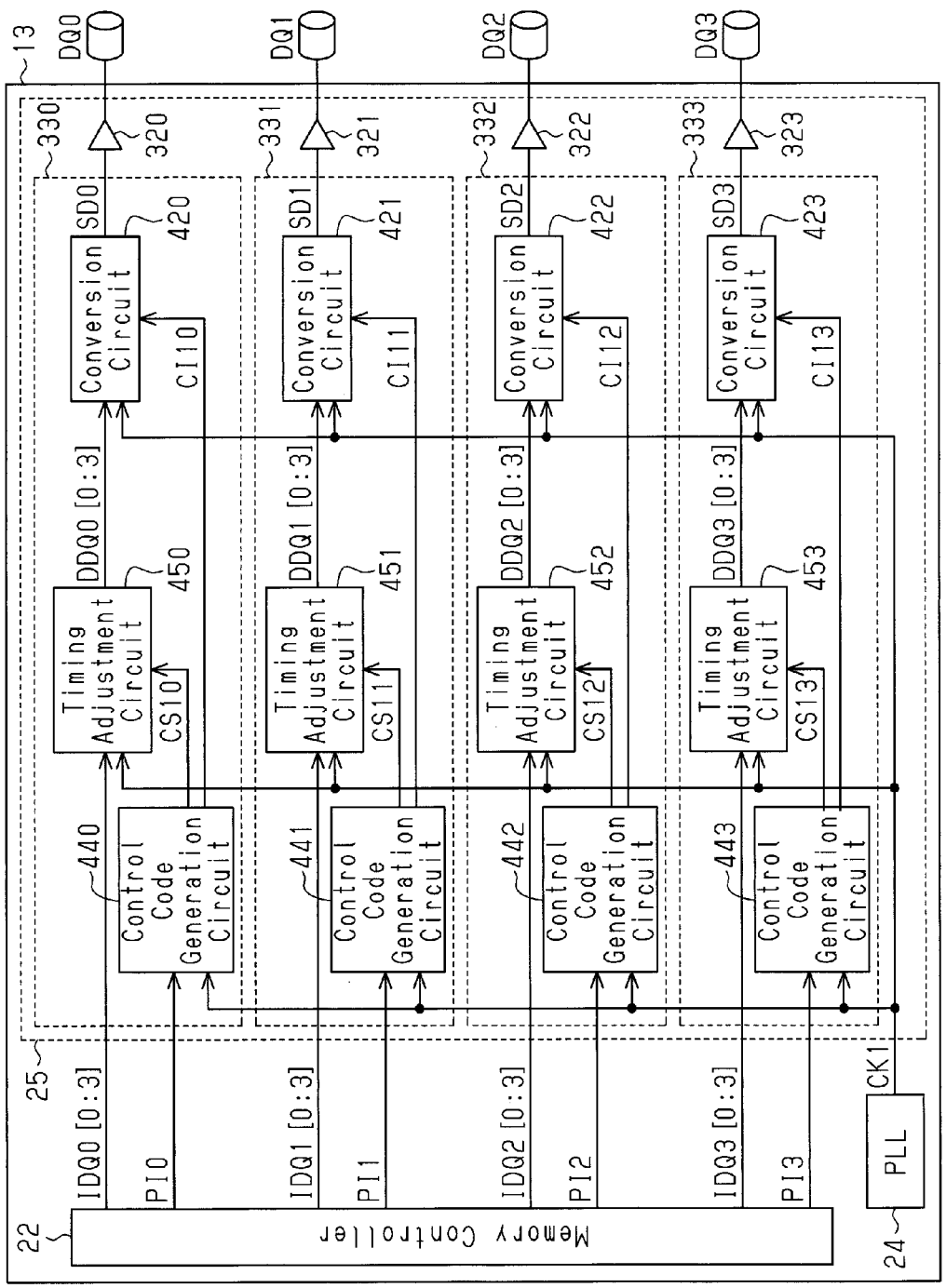
FIG. 10 is a schematic block diagram of an interface circuit according to a second embodiment.

As illustrated in FIG. 10, a control device 13 includes a memory controller 22, and an interface circuit 25. The memory controller 22 outputs data signals IDQ0 [0:3] to IDQ3 [0:3]. Each of the data signals IDQ0 [0:3] to IDQ3 [0:3] is a 4-bit parallel data. The interface circuit 25 converts the 4-bit data signal IDQ0 [0:3] into a plurality of 1-bit data signals DQ0. Similarly, the interface circuit 25 converts the data signals IDQ1 to IDQ3 into data signals DQ1 to DQ3, respectively.

The interface circuit 25 includes four parallel-serial conversion circuits 330 to 333 corresponding to the data signals IDQ0 [0:3] to IDQ3 [0:3] respectively, and four output buffers 320 to 323.

The parallel-serial conversion circuit 330 converts 4-bit data signal IDQ0 [0:3] into four 1-bit data signals SD0. The output buffer 320 outputs the data signals DQ0 on the basis of the data signals SD0. Similarly, the parallel-serial conversion circuits 331 to 333 convert the data signals IDQ1 to IDQ3 into data signals SD1 to SD3, respectively. The output buffers 321 to 323 output the data signals DQ1 to DQ3 on the basis of the data signals SD1 to SD3.

The parallel-serial conversion circuit 330 includes a control code generation circuit 440, a timing adjustment circuit 450, and a conversion circuit 420. The control code generation circuit 440, the timing adjustment circuit 450, and the conversion circuit 420 operate on the basis of a clock signal CK1 generated by a phase locked loop circuit (PLL circuit) 24. The frequency of the clock signal CK1 is equal to the frequency of an internal clock signal CLK output from the memory controller 22. The memory controller 22 outputs the data signals IDQ0 [0:3] to IDQ3 [0:3] in synchronization with the internal clock signal CLK. The parallel-serial conversion circuit 330 converts the data signal IDQ0 [0:3] into the data signals SD0 in synchronization with the clock signal CK1.

The control code generation circuit 440 generates a control signal CS10 for the timing adjustment circuit 450, and a control signal CI10 for the conversion circuit 420, on the basis of phase information PI0.

The timing adjustment circuit 450 controls delay time with respect to each bit data of the data signal IDQ0 [0:3] by unit of half (T/2) of one cycle of the clock signal CK1, in accordance with the control signal CS10. Then, the timing adjustment circuit 450 outputs a delay data signal DDQ0 [0:3] formed by delaying each bit data of the data signal IDQ0 [0:3] depending on the controlled delay time.

The conversion circuit 420 generates a plurality of clock signals formed by adjusting phases with respect to the clock signal CK1, in accordance with the control signal CI0. The phase difference between the clock signal CK1 serving as a reference and the generated plurality of clock signals corresponds to the aforementioned phase information PI0. The conversion circuit 420 converts the 4-bit delay data signal DDQ0 [0:3] output from the timing adjustment circuit 450 into four 1-bit data signals SD0 on the basis of the generated plurality of clock signals. That is, the conversion circuit 420 performs parallel-serial conversion and phase control. Then, the conversion circuit 420 serially outputs the data signals SD0.

Similarly, the parallel-serial conversion circuit 331 includes a control code generation circuit 441, a timing adjustment circuit 451, and a conversion circuit 421. The control code generation circuit 441 generates a control signal CS11 for the timing adjustment circuit 451, and a control signal CI11 for the conversion circuit 421, on the basis of phase information PI1. The timing adjustment circuit 451 outputs a delay data signal DDQ1 [0:3] according to the data signal IDQ1 [0:3], in accordance with the control signal CS11. The conversion circuit 421 converts the delay data signal DDQ1 [0:3] output from the timing adjustment circuit 451 into a plurality of 1-bit data signals SD1, on the basis of a plurality of clock signals formed by adjusting phases with respect to the clock signal CK1, in accordance with the control signal CI11.

The parallel-serial conversion circuit 332 includes a control code generation circuit 442, a timing adjustment circuit 452, and a conversion circuit 422. The control code generation circuit 442 generates a control signal CS12 for the timing adjustment circuit 452, and a control signal CI12 for the conversion circuit 422, on the basis of phase information PI2. The timing adjustment circuit 452 outputs a delay data signal DDQ2 [0:3] according to the data signal IDQ2 [0:3], in accordance with the control signal CS12. The conversion circuit 422 converts the delay data signal DDQ2 [0:3] output from the timing adjustment circuit 452 into a plurality of 1-bit data signals SD2, on the basis of a plurality of clock signals formed by adjusting phases with respect to the clock signal CK1, in accordance with the control signal CI12.

The parallel-serial conversion circuit 333 includes a control code generation circuit 443, a timing adjustment circuit 453, and a conversion circuit 423. The control code generation circuit 443 generates a control signal CS13 for the timing adjustment circuit 453, and a control signal CI13 for the conversion circuit 423, on the basis of phase information PI3. The timing adjustment circuit 453 outputs a delay data signal DDQ3 [0:3] according to the data signal IDQ3 [0:3] in accordance with the control signal CS13. The conversion circuit 423 converts the delay data signal DDQ3 [0:3] output from the timing adjustment circuit 453 into a plurality of 1-bit data signals SD3, on the basis of a plurality of clock signals formed by adjusting phases with respect to the clock signal CK1, in accordance with the control signal CI13.

The timing adjustment circuit 450, the conversion circuit 420, and the control code generation circuit 440 included in the parallel-serial conversion circuit 330 will be described. The parallel-serial conversion circuits 331 to 333 are the same as the parallel-serial conversion circuit 330, and therefore explanation and illustration thereof may be omitted.

Figure 11:
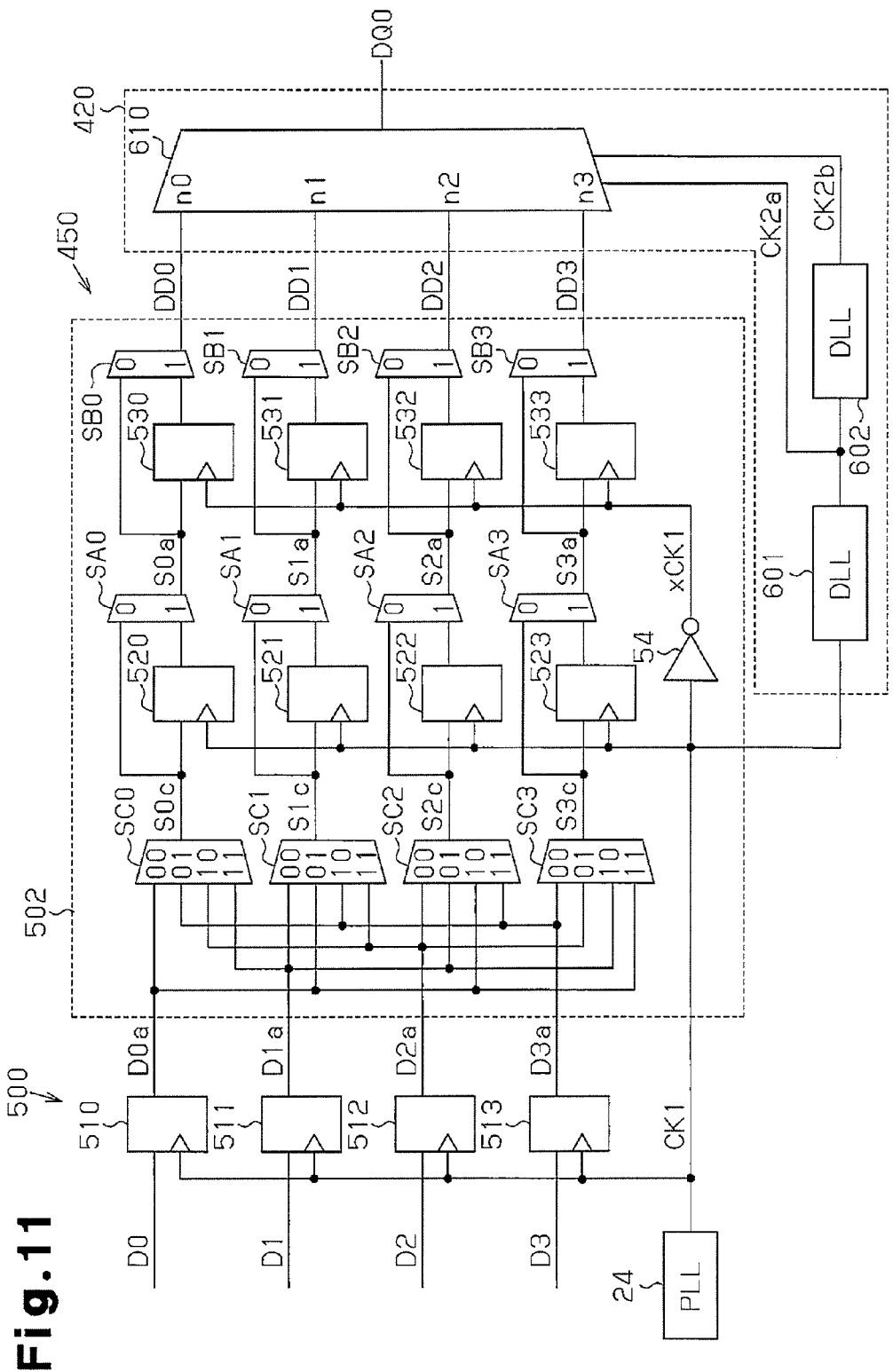
FIG. 11 is a circuit diagram of the interface circuit in FIG. 10.

As illustrated in FIG. 11, the timing adjustment circuit 450 includes a latch circuit 500, and a delay adjustment circuit 502. In FIG. 11, the data signal IDQ0 [0:3] illustrated in FIG. 10 includes data signals D0 to D3. A 1-bit data signal IDQ0 [0] corresponds to the data signal D0, and data signals IDQ0 [1] to IDQ0 [3] correspond to the data signals D1 to D3, respectively.

The flip-flop circuits 510 to 513 in the latch circuit 500 latch, for example, the data signals D0 to D3 in response to the H level clock signal CK1, to output data signals D0a to D3a whose levels are equal to the latched levels, respectively.

The delay adjustment circuit 502 includes flip-flop circuits 520 to 523 and 530 to 533, selection circuits SA0 to SA3 and SB0 to SB3, an inverter circuit 54, and selection circuits SC0 to SC3.

The control signal CS10 output from the control code generation circuit 440, illustrated in FIG. 10 includes control signals the selection circuits SA0 to SA3, SB0 to SB3 and SC0 to SC3.

In order to facilitate the understanding of correspondence, respective control signals for the selection circuits SA0 to SA3, SB0 to SB3 and SC0 to SC3 are denoted by the same reference signs identical with the reference signs of the corresponding selection circuits as necessary.

The selection circuits SC0 to SC3 each includes four input terminals corresponding to the data signals D0a to D3a. The data signals D0a to D3a are circularly shifted to be provided to the respective input terminals of the selection circuits SC0 to SC3. More specifically, the data signal D0a is provided to the first terminal of the selection circuit SC0, the second terminal of the selection circuit SC1, the third terminal of the selection circuit SC2, and the fourth terminal of the selection circuit SC3. The data signal D1a is provided to the first terminal of the selection circuit SC1, the second terminal of the selection circuit SC2, the third terminal of the selection circuit SC3, and the fourth terminal of the selection circuit SC0. The data signal D2a is provided to the first terminal of the selection circuit SC2, the second terminal of the selection circuit SC3, the third terminal of the selection circuit SC0, and the fourth terminal of the selection circuit SC1. The data signal D3a is provided to the first terminal of the selection circuit SC3, the second terminal of the selection circuit SC0, the third terminal of the selection circuit SC1, and the fourth terminal of the selection circuit SC2.

Each of the selection circuits SC0 to SC3 selects one of the four input terminals in response to a control signal provided from the control code generation circuit 440 illustrated in FIG. 10, and the selection circuits SC0 to SC3 output signals S0c to S3c equal to signals provided to the selected input terminals, respectively. The control signal for each of the selection circuits SC0 to SC3 is a 2-bit signal. In FIG. 11, codes "00" "01" "10" "11" described in the selection circuits SC0 to SC3 each indicate the correspondence between the logical value of the 2-bit control signal, and the terminal selected by the control signal. For example, the selection circuit SC0 selects the first terminal in response to a control signal whose logical value is "00", to output the signal S0c equal to a signal (D0a) provided to the first terminal. The selection circuit SC0 selects the second terminal in response to a control signal whose logical value is "01", to output the signal S0c equal to a signal (D3a) provided to the second terminal. The selection circuit SC0 selects the third terminal in response to a control signal whose logical value is "10", to output the signal S0c equal to a signal (D2a) provided to the third terminal. The selection circuit SC0 selects the fourth terminal in response to a control signal whose logical value is "11", to output the signal S0c equal to a signal (D1a) provided to the fourth terminal.

Similarly, the selection circuit SC1 selects a terminal corresponding to the logical value "00" ("01", "10", "11") of the control signal, to output the signal S1c equal to a signal D1a (D0a, D3a, D2a) provided to the selected terminal. Similarly, the selection circuit SC2 selects a terminal corresponding to the logical value "00" ("01", "10", "11") of the control signal, to output the signal S2c equal to a signal D2a (Dia, D0a, D3a) provided to the selected terminal. Similarly, the selection circuit SC3 selects a terminal corresponding to the logical value "00" ("01", "10", "11") of the control signal, to output the signal S3c equal to a signal D3a (D2a, D1a, D3a) provided to the selected terminal.

The signals S0c to S3c output from the selection circuits SC0 to SC3 respectively are provided to the respective data terminals of the flip-flop circuits 520 to 523, and the respective first terminals of the selection circuits SA0 to SA3. The flip-flop circuits 520 to 523 latch, for example, the signals S0c to S3c in response to the H level clock signal CK1, to output signals whose levels are equal to the latched level. The respective output signals from the flip-flop circuits 520 to 523 are provided to the second terminals of the selection circuits SA0 to SA3. The selection circuits SA0 to SA3 select the first terminals or the second terminals according to the control signals SA0 to SA3, respectively. The selection circuits SA0 to SA3 select, for example, the first terminals in response to the L level (logical value "0") control signals SA0 to SA3, to select the second terminals in response to the H level (logical value "1") control signals SA0 to SA3, respectively. The selection circuits SA0 to SA3 output signals S0a to S3a which are equal to signals provided to the selected terminals, respectively.

The output signals S0a to S03 from the selection circuits SA0 to SA3 are provided to the respective data terminals of the flip-flop circuits 530 to 533, and the respective first terminals of the selection circuits SB0 to SB3. The flip-flop circuits 530 to 533 latch, for example, the data signals S0a to S3a in response to the H level inverted clock signal xCK1, to output signals whose levels are equal to the latched levels. The respective output signals from the flip-flop circuits 530 to 533 are provided to the second terminals of the selection circuits SB0 to SB3. The selection circuits SB0 to SB3 select the first terminals or the second terminals according to the control signals SB0 to SB3, respectively. The selection circuits SB0 to SB3 select, for example, the first terminals in response to the L level (logical value "0") control signals SB0 to SB3, to select the second terminals in response to the H level (logical value "1") control signals SB0 to SB3, respectively. The selection circuits SB0 to SB3 output signals DD0 to DD3 which are equal to signals provided to the selected terminals, respectively.

The conversion circuit 420 includes two delay locked loop circuits (DLL circuits) 601 and 602, and a selection circuit 610. The clock signal CK1 and the control signal CI10 are provided to the delay locked loop circuit 601. The delay locked loop circuit 601 generates a clock signal CK2a formed by delaying the clock signal CK1 according to the control signal CI0. Accordingly, the cycle of the clock signal CK2a is equal to the cycle of the clock signal CK1. The delay locked loop circuit 601 controls the phase difference of the clock signal CK2a with respect to the clock signal CK1, according to the control signal CI10. The delay locked loop circuit 601 is capable of controlling the clock signal CK2a with respect to the clock signal CK1 in a predetermined range (e.g., 45 deg. to 135 deg.).

The clock signal CK2a is provided to the delay locked loop circuit 602 and the selection circuit 610. The delay locked loop circuit 602 delays the clock signal CK2a to generate a clock signal CK2b. Accordingly, the cycle of the clock signal CK2b is equal to the cycle of the clock signal CK2a. The phase difference of the clock signal CK2b with respect to the clock signal CK2a is a predetermined phase difference (e.g., 90 deg.). The clock signal CK2b is provided to the selection circuit 610.

The selection circuit 610 includes four input terminals n0 to n3. The signals DD0 to DD3 are provided to the input terminals n0 to n3, respectively. The selection circuit 610 selects one of the four input terminals n0 to n3 in accordance with the logical levels of the clock signals CK2a and CK2b. The selection circuit 610 outputs a signal equal to a signal provided to the selected terminal, namely, the 1-bit data signal SD0.

The operation of the aforementioned parallel-serial conversion circuit 330 will be described.

As illustrated in FIG. 11, the flip-flop circuits 510 to 513 in the latch circuit 500 latch the data signals D0 to D3 in response to the clock signal CK1, to output the signals D0a to D3a whose levels are equal to the latched levels, respectively. The selection circuits SC0 to SC3 output the signals S0c to S3c equal to the signals D0a to D3a provided to the input terminals selected according to the control signal. Then, the flip-flop circuits 520 to 523 of the delay adjustment circuit 502 latch the signals S0c to S3c in response to the clock signal CK1, to output the respective signals whose levels are equal to the latched levels. Accordingly, the flip-flop circuits 520 to 523 output the respective signals with delay by one cycle of the clock signal CK1 with respect to the signals S0c to S3c. The selection circuits SA0 to SA3 output the signals S0a to S3a equal to the signals provided to the corresponding first terminals in response to the control signals whose logical values are "0", respectively, and output the signals S0a to S3a equal to the signals provided to the corresponding second terminals in response to the control signals whose logical values are "1", respectively.

The flip-flop circuits 530 to 533 of the delay adjustment circuit 502 latch the signals S0a to S3a in response to the inverted clock signal xCK1, to output signals whose levels are equal to the latched levels, respectively. Accordingly, the flip-flop circuits 530 to 533 output the respective signals with delay by half of one cycle of the clock signal CK1 with respect to the signals S0a to S3a. The selection circuits SB0 to SB3 output the signals DD0 to DD3 equal to the signals provided to the corresponding first terminals in response to the control signals whose logical values are "0", respectively, and output the signals DD0 to DD3 equal to the signals provided to the corresponding second terminals in response to the control signals whose logical values are "1", respectively.

As described above, the control code generation circuit 440 illustrated in FIG. 10 generates the control signal CS10 (control signals SA0 to SA3, SB0 to SB3 and SC0 to SC3) for the selection circuits SA0 to SA3, SB0 to SB3 and SC0 to SC3 illustrated in FIG. 11, according to the phase information PI0. The control signal CS10 corresponds to the phase difference with respect to the clock signal CK1. Additionally, the control code generation circuit 440 generates the control signal CI10 for the delay locked loop circuit 601 illustrated in FIG. 11, according to the phase information PI0.

FIG. 12 illustrates the correspondence between the logical values (2-bit) of control signals output from the control code generation circuit 440 illustrated in FIG. 10 to the selection circuits SC0 to SC3, and the data signals D0 to D3 selected in the selection circuits SC0 to SC3 respectively, with respect to desired phases. FIG. 13 illustrates an example of the phase adjustment ranges in the delay locked loop circuit 601, and the logical values of the control signals for the selection circuits SA0 to SA3 and SB0 to SB3, with respect to desired phases.

For example, as illustrated in FIG. 12, in a case where a desired phase with respect to the data signals SD0 (DQ0) is "45 deg. to 135 deg.", control signals whose logical values are "00" are provided to the selection circuits SC0 to SC3. As illustrated in FIG. 13, in a case where the phase adjustment range in the delay locked loop circuit 601 is "45 deg. to 135 deg." Additionally, the logical values of the control signals for the selection circuits SA0 to SA3, and the logical values of the control signals for the selection circuits SB0 to SB3 are "0, 0, 0, 0" and "0, 0, 1, 1", respectively.

The selection circuit SC0 outputs the signal S0c equal to the data signal D0a in response to the control signal whose logical value is "00". Similarly, the selection circuits SC1 to SC3 output the signals S1c to S3c equal to the data signals D1a to D3a, in response to the control signals whose logical values are "00", respectively.

Figure 14:
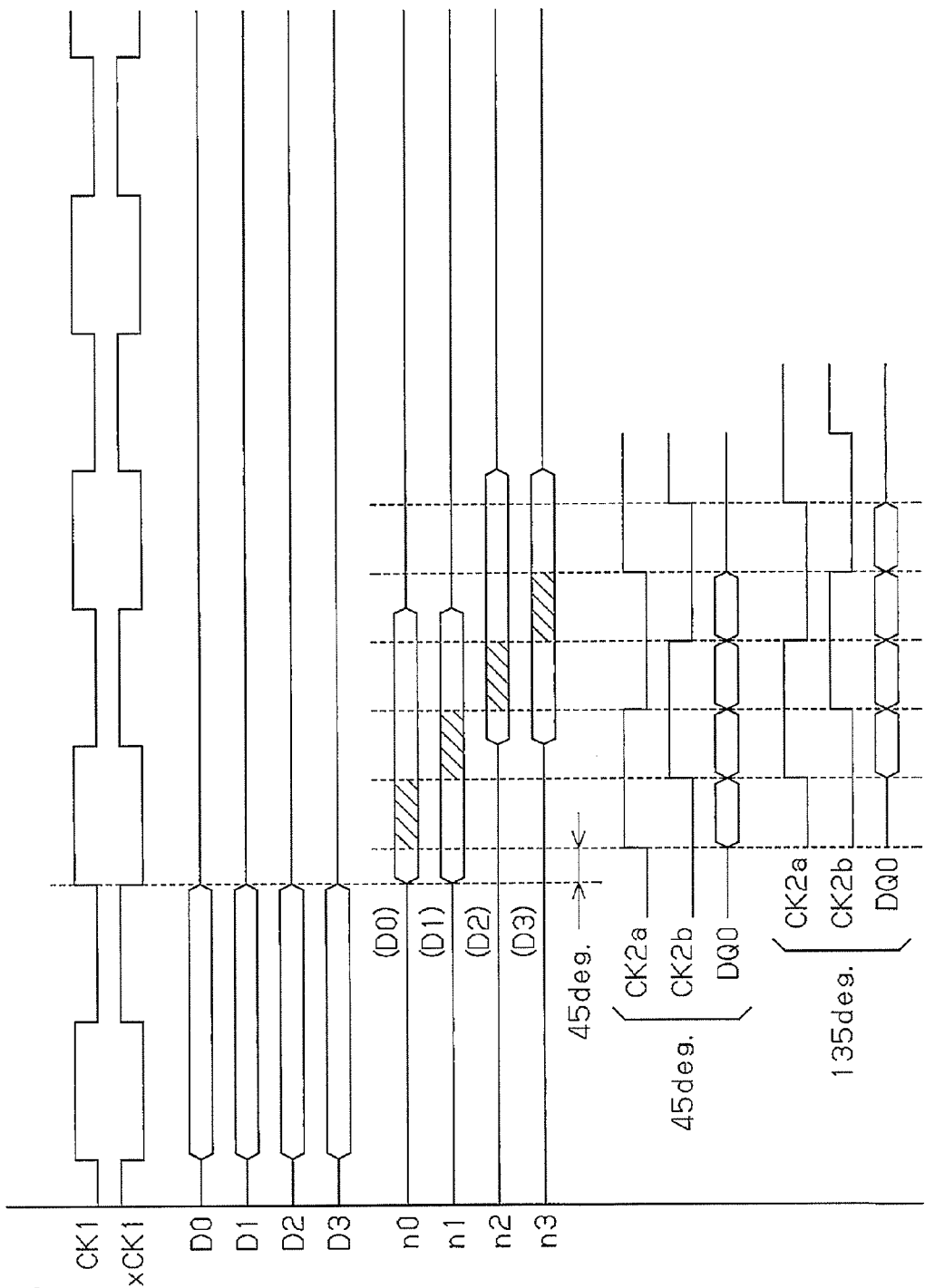
FIGS. 14 to 17 each are a timing diagram for illustrating the operation of the interface circuit of the second embodiment.

The selection circuit SA0 outputs a signal that bypasses the flip-flop circuit 520, namely, a signal S0a whose timing is equal to the timing of the data signal D0a, in response to the control signal whose logical value is "0". The selection circuit SB0 outputs the signal DD0 at timing equal to the timing of the signal that bypasses the flip-flop circuit 530, namely, the data signal S0a, in response to the control signal whose logical value is "0". Consequently, as illustrated in FIG. 14, the data signal D0 is provided to the terminal n0 of the selection circuit 610 at a phase difference of 0 deg. with respect to the clock signal CK1.

The selection circuit SA1 outputs a signal that bypasses the flip-flop circuit 521, namely, a signal S1a whose timing is equal to the timing of the data signal D1a, in response to the control signal whose logical value is "0". The selection circuit SB1 outputs the signal DD1 at timing equal to the timing of the signal that bypasses the flip-flop circuit 521, namely, the data signal S1a, in response to the control signal whose logical value is "0". Consequently, as illustrated in FIG. 14, the data signal D1 is provided to the terminal n1 of the selection circuit 610 at a phase difference of 0 deg. with respect to the clock signal CK1.

The selection circuit SA2 outputs a signal that bypasses the flip-flop circuit 522, namely, a signal S2a whose timing is equal to the timing of the data signal D2a, in response to the control signal whose logical value is "0". The selection circuit SB2 outputs the signal DD2 at the timing of delaying by half of one cycle of the clock signal CK1 with respect to the signal that is latched by the flip-flop circuit 522, namely, the signal S2a, in response to the control signal whose logical value is "1". Consequently, as illustrated in FIG. 14, the data signal D2 is provided to the terminal n2 of the selection circuit 610 at a phase difference of 180 deg. with respect to the clock signal CK1.

The selection circuit SA3 outputs a signal that bypasses the flip-flop circuit 523, namely, a signal S3a whose timing is equal to the timing of the data signal D3a, in response to the control signal whose logical value is "0". The selection circuit SB3 outputs the signal DD3 at the timing of delaying by half of one cycle of the clock signal CK1 with respect to the signal that is latched by the flip-flop circuit 523, namely, the signal S3a, in response to the control signal whose logical value is "0". Consequently, as illustrated in FIG. 14, the data signal D3 is provided to the terminal n3 of the selection circuit 610 at a phase difference of 180 deg. with respect to the clock signal CK1.

In FIG. 14, hatching portions in the respective signals provided to the terminals n0 to n3 denote periods selected by the logical levels of the clock signals CK2a and CK2b, in a case where the phase difference between the clock signal CK1 and the clock signal CK2a is 45 deg. For example, during the period of the H level clock signal CK2a and the L level clock signal CK2b, the terminal n0 of the selection circuit 610 illustrated in FIG. 11 is selected, and the signal provided to the terminal n0, namely, the data signal D0 is output as the data signal SD0 (DQ0). During the period of the H level clock signal CK2a and the H level clock signal CK2b, the terminal n1 of the selection circuit 610 illustrated in FIG. 11 is selected, and the signal provided to the terminal n1, namely, the data signal D1 is output as the data signal SD0 (DQ0). During the period of the L level clock signal CK2a and the H level clock signal CK2b, the terminal n2 of the selection circuit 610 illustrated in FIG. 11 is selected, and the signal provided to the terminal n2, namely, the data signal D2 is output as the data signal SD0 (DQ0). During the period of the L level clock signal CK2a and the L level clock signal CK2b, the terminal n3 of the selection circuit 610 illustrated in FIG. 11 is selected, and the signal provided to the terminal n3, namely, the data signal D3 is output as the data signal SD0 (DQ0).

As illustrated in FIG. 12, in a case where the desired phase with respect to the data signals SD0 (DQ0) is "135 deg. to 225 deg.", control signals whose logical values are "01" are provided to the selection circuits SC0 to SC3. The selection circuit SC0 outputs the signal S0c equal to the data signal D3 (D3a). Similarly, the selection circuits SC1, SC2 and SC3 output the signals S1c to S3c equal to the data signals D0 (D0a), D1 (D1a) and D2 (D2a), respectively.

As illustrated in FIG. 13, in a case where the desired phase with respect to the data signals SD0 (DQ0) is "135 deg. to 225 deg.", the phase adjustment range in the delay locked loop circuit 601 is "45 deg. to 135 deg." The logical values of the control signals for the selection circuits SA0 to SA3, and the logical values of the control signals for the selection circuits SB0 to SB3 are "1, 0, 0, 0" and "0, 0, 1, 1", respectively.

Figure 15:
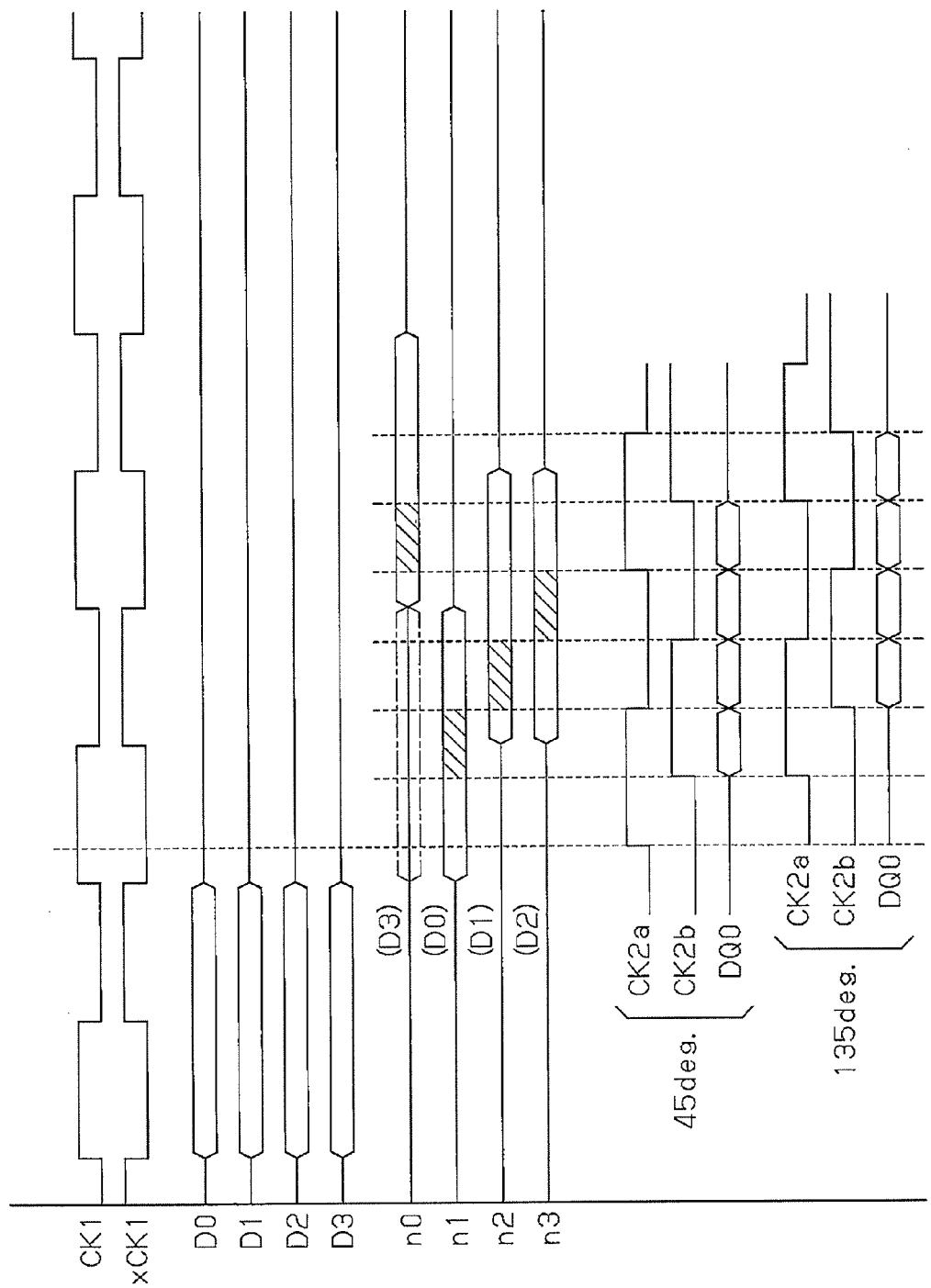

As illustrated in FIG. 15, the data signal D0 is provided to the terminal n1 of the selection circuit 610 at a phase difference of 0 deg. with respect to the clock signal CK1. The data signal D1 is provided to the terminal n2 of the selection circuit 610 at a phase difference of 180 deg. with respect to the clock signal CK1. The data signal D2 is provided to the terminal n3 of the selection circuit 610 at a phase difference of 180 deg. with respect to the clock signal CK1. The data signal D3 is provided to the terminal n0 of the selection circuit 610 at a phase difference of 360 deg. with respect to the clock signal CK1.

In FIG. 15, hatching portions in the respective signals provided to the terminals n0 to n3 denote periods selected by the logical levels of the clock signals CK2a and CK2b, in a case where the phase difference between the clock signal CK1 and the clock signal CK2a is 45 deg. The terminals n1, n2, n3 and n0 are serially selected in accordance with the logical levels of the clock signal CK2a and the clock signal CK2b. Then, the data signals D0, D1, D2 and D3 provided to the terminals n1, n2, n3 and n0 respectively are output as the data signals SD0 (DQ0).

As illustrated in FIG. 12, in a case where the desired phase with respect to the data signals SD0 (DQ0) is "225 deg. to 315 deg.", control signals whose logical values are "10" are provided to the selection circuits SC0 to SC3. The selection circuit SC0 outputs the signal S0c equal to the data signal D2 (D2a). Similarly, the selection circuits SC1, SC2 and SC3 output the signals S1c to S3c equal to the data signals D3 (D3a), D0 (D0a) and D1 (D1a), respectively.

As illustrated in FIG. 13, in a case where the desired phase with respect to the data signals SD0 (DQ0) is "225 deg. to 315 deg.", the phase adjustment range in the delay locked loop circuit 601 is "45 deg. to 135 deg." The logical values of the control signals for the selection circuits SA0 to SA3, and the logical values of the control signals for the selection circuits SB0 to SB3 are "1, 1, 0, 0" and "0, 0, 1, 1", respectively.

Figure 16:
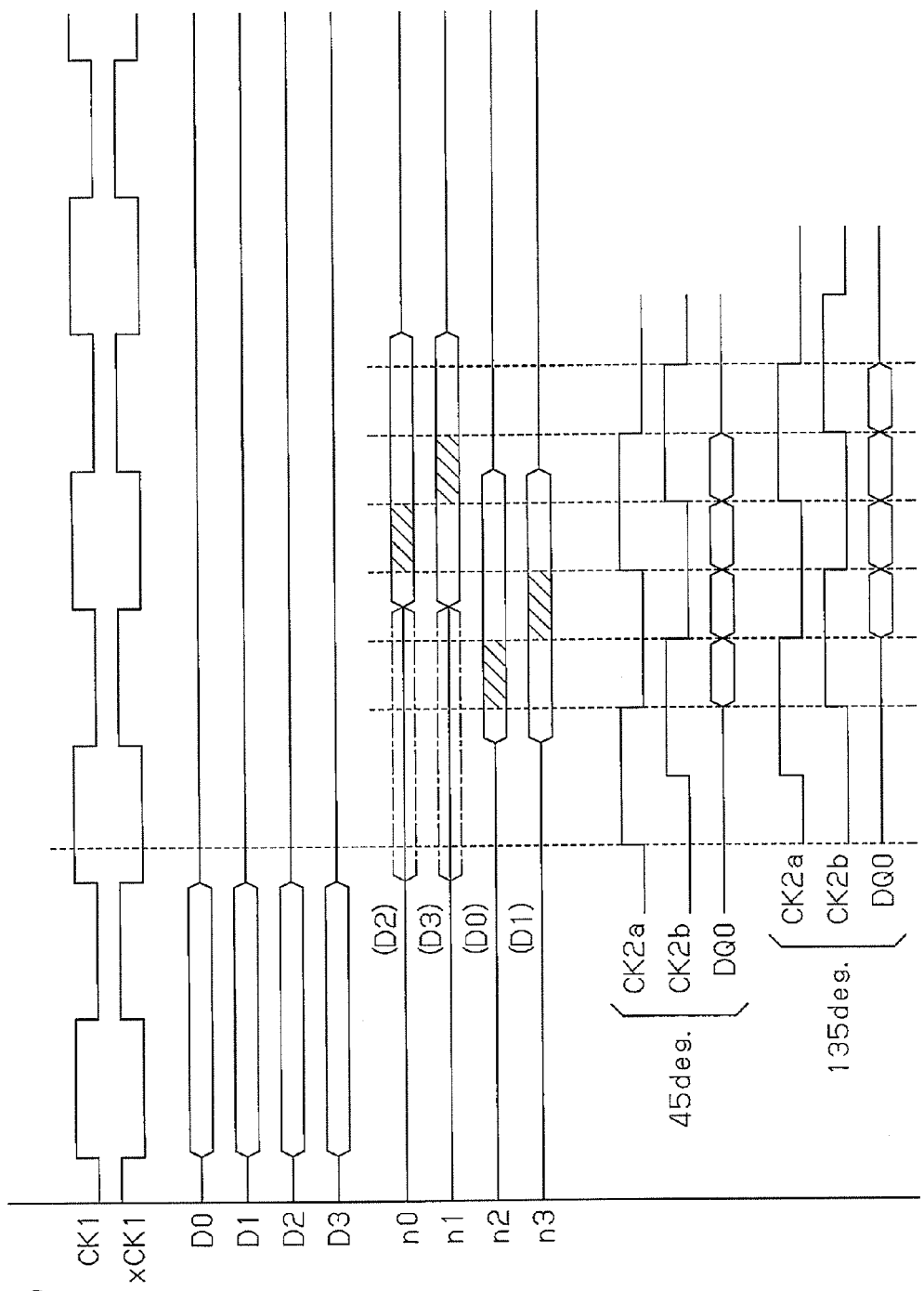

As illustrated in FIG. 16, the data signal D0 is provided to the terminal n2 of the selection circuit 610 at a phase difference of 180 deg. with respect to the clock signal CK1. The data signal D1 is provided to the terminal n3 of the selection circuit 610 at a phase difference of 180 deg. with respect to the clock signal CK1. The data signal D2 is provided to the terminal n0 of the selection circuit 610 at a phase difference of 360 deg. with respect to the clock signal CK1. The data signal D3 is provided to the terminal n1 of the selection circuit 610 at a phase difference of 360 deg. with respect to the clock signal CK1.

In FIG. 16, hatching portions in the respective signals provided to the terminals n0 to n3 denote periods selected by the logical levels of the clock signals CK2a and CK2b, in a case where the phase difference between the clock signal CK1 and the clock signal CK2a is 45 deg. The terminals n2, n3, n0 and n1 are serially selected in accordance with the logical levels of the clock signal CK2a and the clock signal CK2b. Then, the data signals D0, D1, D2 and D3 provided to the terminals n2, n3, n0 and n1 respectively are output as the data signals SD0 (DQ0).

As illustrated in FIG. 12, in a case where the desired phase with respect to the data signals SD0 (DQ0) is "315 deg. to 405 deg.", control signals whose logical values are "11" are provided to the selection circuits SC0 to SC3. The selection circuit SC0 outputs the signal S0c equal to the data signal D1 (D1a). Similarly, the selection circuits SC1, SC2 and SC3 output the signals S1c to S3c equal to the data signals D2 (D2a), D3 (D3a) and D0 (D0a), respectively.

As illustrated in FIG. 13, in a case where the desired phase with respect to the data signals SD0 (DQ0) is "315 deg. to 405 deg.", the phase adjustment range in the delay locked loop circuit 601 is "45 deg. to 135 deg." The logical values of the control signals for the selection circuits SA0 to SA3, and the logical values of the control signals for the selection circuits SB0 to SB3 are "1, 1, 1, 0" and "0, 0, 1, 1", respectively.

Figure 17:
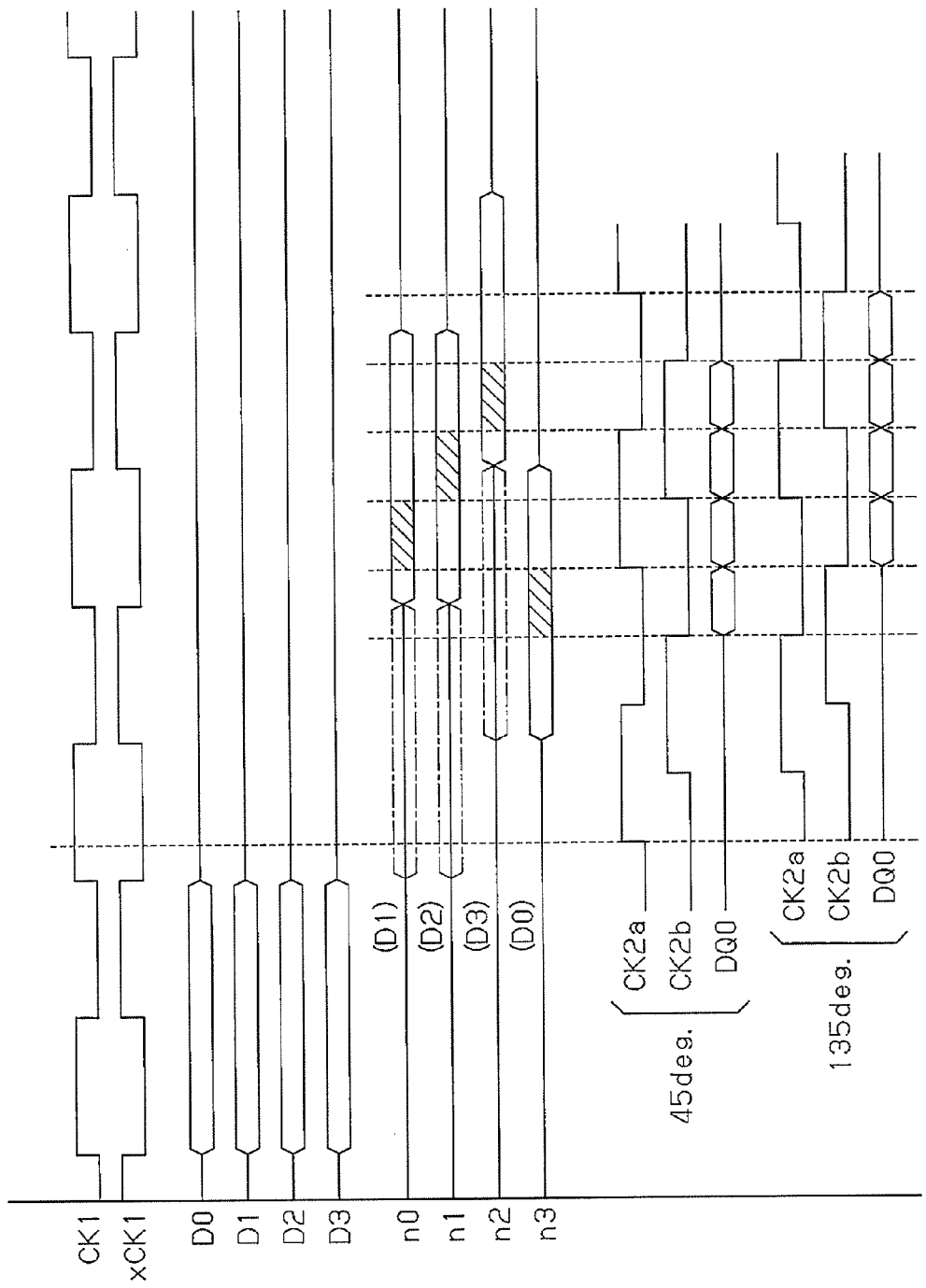

As illustrated in FIG. 17, the data signal D0 is provided to the terminal n3 of the selection circuit 610 at a phase difference of 180 deg. with respect to the clock signal CK1. The data signal D1 is provided to the terminal n0 of the selection circuit 610 at a phase difference of 270 deg. with respect to the clock signal CK1. The data signal D2 is provided to the terminal n1 of the selection circuit 610 at a phase difference of 360 deg. with respect to the clock signal CK1. The data signal D3 is provided to the terminal n2 of the selection circuit 610 at a phase difference of 540 deg. with respect to the clock signal CK1.

In FIG. 17, hatching portions in the respective signals provided to the terminals n0 to n3 denote periods selected by the logical levels of the clock signals CK2a and CK2b, in a case where the phase difference between the clock signal CK1 and the clock signal CK2a is 45 deg. The terminals n3, n0, n1 and n2 are serially selected in accordance with the logical levels of the clock signal CK2a and the clock signal CK2b. Then, the data signals D0, D1, D2 and D3 provided to the terminals n3, n0, n1 and n2 respectively are output as the data signals SD0 (DQ0).

As described above, according to the second embodiment, the following effects are produced in addition to the effects of the first embodiment.

(2-1) The delay adjustment circuit 502 in the timing adjustment circuit 450 includes the flip-flop circuits 520 to 523 and 530 to 533, the selection circuits SA0 to SA3 and SB0 to SB3, the inverter circuit 54, and the selection circuits SC0 to SC3. Each of the selection circuits SC0 to SC3 selects one of the four input terminals in response to a control signal provided from the control code generation circuit 440, and the selection circuits SC0 to SC3 output the signals S0c to S3c equal to signals provided to the selected input terminals, respectively. The signals S0c to S3c are provided to the terminals n0 to n3 of the selection circuit 610 in the conversion circuit 420 via the flip-flop circuits 520 to 523 and 530 to 533, and the selection circuits SA0 to SA3 and SB0 to SB3 in the delay adjustment circuit 502, respectively. Accordingly, the data signals D0a to D3a (D0 to D3) are provided to the terminals n0 to n3 of the selection circuit 610 according to the control signals, depending on the control signals.

Accordingly, in the selection circuit 610, the data signals D0a to D3a (D0 to D3) are provided to terminals selected according to the clock signals CK2a and CK2b, so that timing when the data signals D0a to D3a (D0 to D3) are selected may be adjusted. Therefore, even when the phase adjustment range of the clock signal CK2a in the delay locked loop circuit 601 of the conversion circuit 420 is not widened, the output timing of the data signals SD0 may be adjusted in a wide range.

Third Embodiment

The difference of a third embodiment from the first and second embodiments will be mainly described. The same components as those of the first and second embodiments are denoted by the same reference numerals, and explanation and illustration of all of or a part of these may be omitted.

Figure 18:
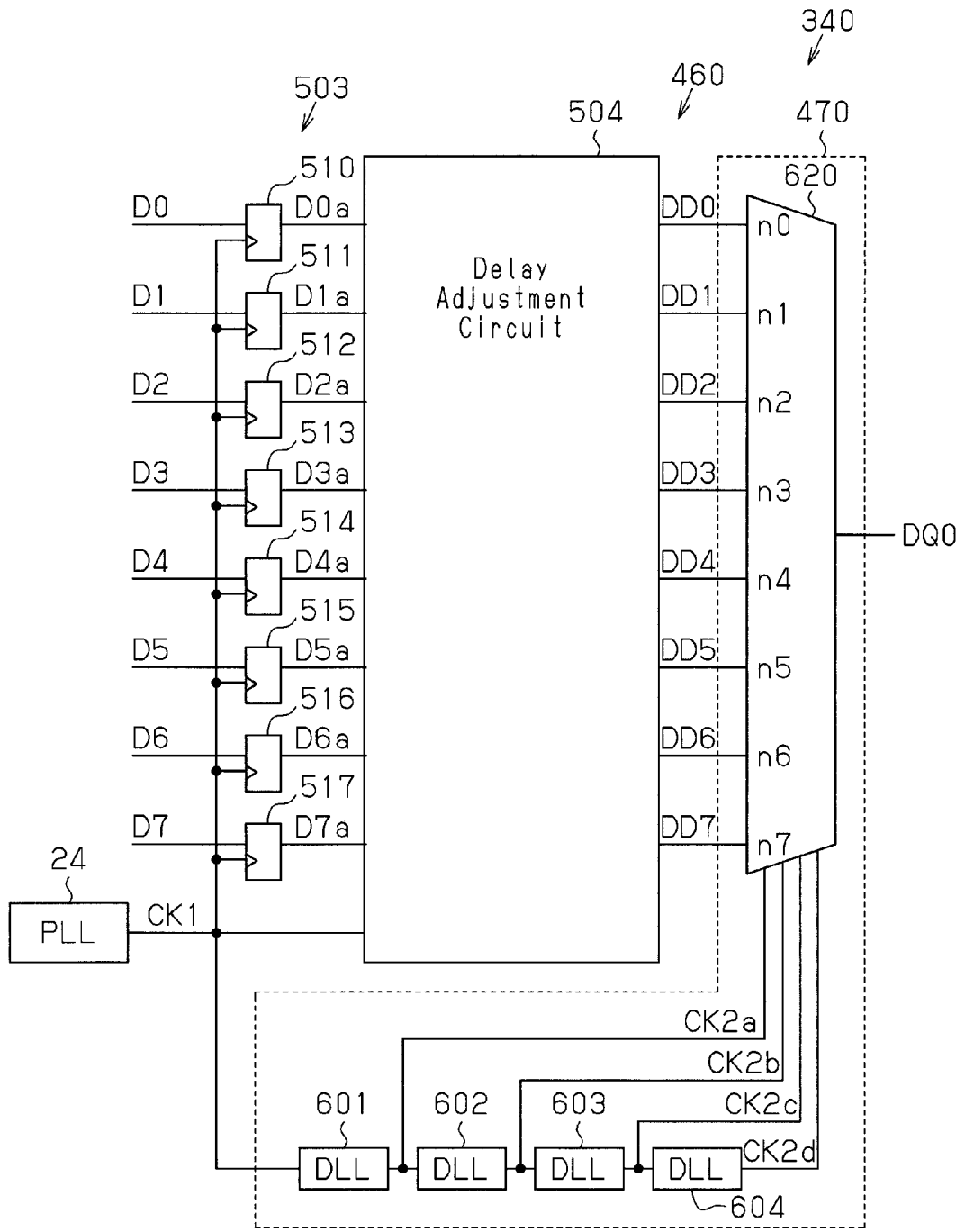
FIG. 18 is a circuit diagram of an interface circuit according to a third embodiment.

As illustrated in FIG. 18, a parallel-serial conversion circuit 340 converts 8-bit data signals D0 to D7 into eight 1-bit data signals SD0.

The parallel-serial conversion circuit 340 includes a timing adjustment circuit 460, a conversion circuit 470, and a control code generation circuit (not illustrated). The timing adjustment circuit 460, the conversion circuit 470, and the control code generation circuit operate on the basis of a clock signal CK1 generated by a phase locked loop circuit (PLL circuit) 24.

The timing adjustment circuit 460 includes a latch circuit 503, and a delay adjustment circuit 504. The latch circuit 503 includes flip-flop circuits 510 to 517 corresponding to data signals D0 to D7 respectively. The flip-flop circuits 510 to 517 latch, for example, the data signals D0 to D7 in response to the H level clock signal CK1, to output data signals D0a to D7a whose levels are equal to the latched levels, respectively.

Figure 19:
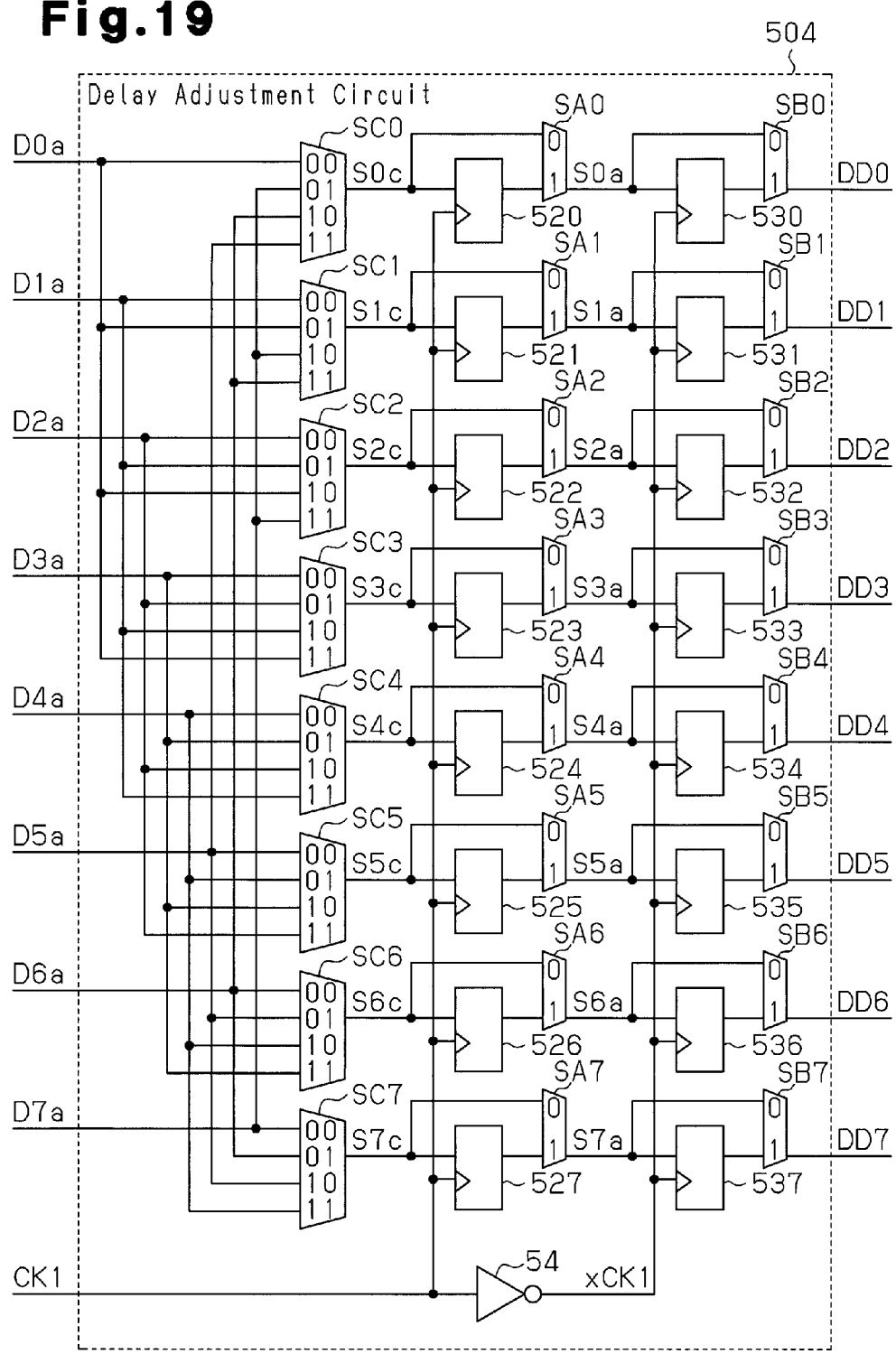
FIG. 19 is a circuit diagram of a delay adjustment circuit of the third embodiment.

As illustrated in FIG. 19, the delay adjustment circuit 504 includes flip-flop circuits 520 to 527 and 530 to 537, selection circuits SA0 to SA7 and SB0 to SB7, an inverter circuit 54, and selection circuits SC0 to SC7.

The selection circuits SC0 to SC7 each include a plurality of (four in the figure) input terminals. The data signals D0a to D7a are circularly shifted to be provided to the respective input terminals of the selection circuits SC0 to SC7. Each of the selection circuits SC0 to SC7 selects one of the input terminals in response to a control signal provided from the control code generation circuit (not illustrated), and the selection circuits SC0 to SC7 output signals S0c to S7c equal to signals provided to the selected input terminals, respectively.

In FIG. 19, codes "00" "01" "10" "11" described in the selection circuits SC0 to SC7 each indicate the correspondence between the logical value of the 2-bit control signal, and the terminal selected by the control signal. FIG. 19 illustrates a case where the phase adjustment range of the data signals SD0 is 45 deg. to 225 deg. Similarly to the first and second embodiments, the circuits illustrated in FIG. 18 and FIG. 19 easily enable a phase adjustment range of 45 deg. to 405 deg.

The signals S0c to S7c output from the selection circuits SC0 to SC7 respectively are provided to the respective data terminals of the flip-flop circuits 520 to 527, and the respective first terminals of the selection circuits SA0 to SA7. The flip-flop circuits 520 to 527 latch, for example, the signals S0c to S7c in response to the H level clock signal CK1, to output signals whose levels are equal to the latched level. The respective output signals from the flip-flop circuits 520 to 527 are provided to the respective second terminals of the selection circuits SA0 to SA7. The selection circuits SA0 to SA7 select the first terminals or the second terminals according to control signals SA0 to SA7, respectively. The selection circuits SA0 to SA7 select, for example, the first terminals in response to the L level (logical value "0") control signals SA0 to SA7, to select the second terminals in response to the H level (logical value "1") control signals SA0 to SA7, respectively. The selection circuits SA0 to SA7 output signals S0a to S7a which are equal to signals provided to the selected terminals, respectively.

The output signals S0a to S7a from the selection circuits SA0 to SA7 are provided to the respective data terminals of the flip-flop circuits 530 to 537, and the respective first terminals of the selection circuits SB0 to SB7. The flip-flop circuits 530 to 537 latch, for example, the data signals S0a to S7a in response to an H level inverted clock signal xCK1, to output signals whose levels are equal to the latched levels. The respective output signals from the flip-flop circuits 530 to 537 are provided to the respective second terminals of the selection circuits SB0 to SB7, respectively. The selection circuits SB0 to SB7 select the first terminals or the second terminals according to the control signals SB0 to SB7, respectively. The selection circuits SB0 to SB7 selects, for example, the first terminals in response to the L level (logical value "0") control signals SB0 to SB7, to select the second terminals in response to the H level (logical value "1") control signals SB0 to SB7, respectively. The selection circuits SB0 to SB7 output signals DD0 to DD7 which are equal to signals provided to the selected terminals, respectively.

The conversion circuit 470 includes four delay locked loop circuits (DLL circuits) 601 to 604, and a selection circuit 620. The clock signal CK1 and a control signal are provided to the delay locked loop circuit 601. The delay locked loop circuit 601 generates a clock signal CK2a formed by delaying the clock signal CK1 according to the control signal. The delay locked loop circuit 601 controls the phase difference of the clock signal CK2a with respect to the clock signal CK1, according to the control signal. The delay locked loop circuit 601 is capable of controlling the clock signal CK2a with respect to the clock signal CK1 in a predetermined range (e.g., 45 deg. to 90 deg.).

The clock signal CK2a is provided to the delay locked loop circuit 602 and the selection circuit 620. The delay locked loop circuit 602 delays the clock signal CK2a, to generate the clock signal CK2b having a predetermined phase difference (e.g., 45 deg.) with respect to the clock signal CK2a. The clock signal CK2b is provided to a delay locked loop circuit 603 and the selection circuit 620. Similarly, the delay locked loop circuit 603 delays the clock signal CK2b, to generate a clock signal CK2c having a predetermined phase difference (e.g., 45 deg.) with respect to the clock signal CK2b. The clock signal CK2c is provided to a delay locked loop circuit 604 and the selection circuit 620. Similarly, the delay locked loop circuit 604 delays the clock signal CK2c, to generate a clock signal CK2d with a predetermined phase difference (e.g., 45 deg.) with respect to the clock signal CK2c. The clock signal CK2d is provided to the selection circuit 620. The cycles of the clock signals CK2a to CK2d are equal to the cycle of the clock signal CK1.

The selection circuit 620 includes eight input terminals n0 to n7. The signals DD0 to DD7 are provided to the input terminals n0 to n7, respectively. The selection circuit 620 selects one of the eight input terminals n0 to n7 in accordance with the logical levels of the clock signals CK2a to CK2d.

The selection circuit 620 outputs a signal equal to a signal provided to the selected terminal, namely, the 1-bit data signal SD0.

The operation of the parallel-serial conversion circuit 340 will be described.

As described above, the control code generation circuit (not illustrated) generates control signals for the selection circuits SA0 to SA7, SB0 to SB7 and SC0 to SC7 illustrated in FIG. 19, according to the phase information PI0. The control signals correspond to the phase difference with respect to the clock signal CK1. Additionally, the control code generation circuit generates a control signal for the delay locked loop circuit 601 illustrated in FIG. 18, according to the phase information PI0.

FIG. 20A illustrates the correspondence between the logical values (2-bit) of control signals output from the control code generation circuit (not illustrated) to the selection circuits SC0 to SC3, and the data signals D0 to D7 selected in the selection circuits SC0 to SC7, with respect to desired phases. FIG. 20B illustrates an example of the phase adjustment ranges in the delay locked loop circuit 601, and the logical values of the control signals for the selection circuits SA0 to SA7 and SB0 to SB7, with respect to desired phases. FIG. 20A and FIG. 20B illustrate control signals for the range of 45 deg. to 225 deg. in the phase adjustment ranges of the data signals SD0 with respect to the clock signal CK1.

As illustrated in FIG. 20A, in a case where a desired phase with respect to the data signals SD0 is "45 deg. to 90 deg.", control signals whose logical values are "00" are provided to the selection circuits SC0 to SC7. The selection circuits SC0 to SC7 output the signals S0c to S7c equal to data signals D0 (D0a) to D7 (D7a), respectively. Then, as illustrated in FIG. 20B, control signals for the selection circuits SA0 to SA7 and SB0 to SB7 are provided.

Figure 21:
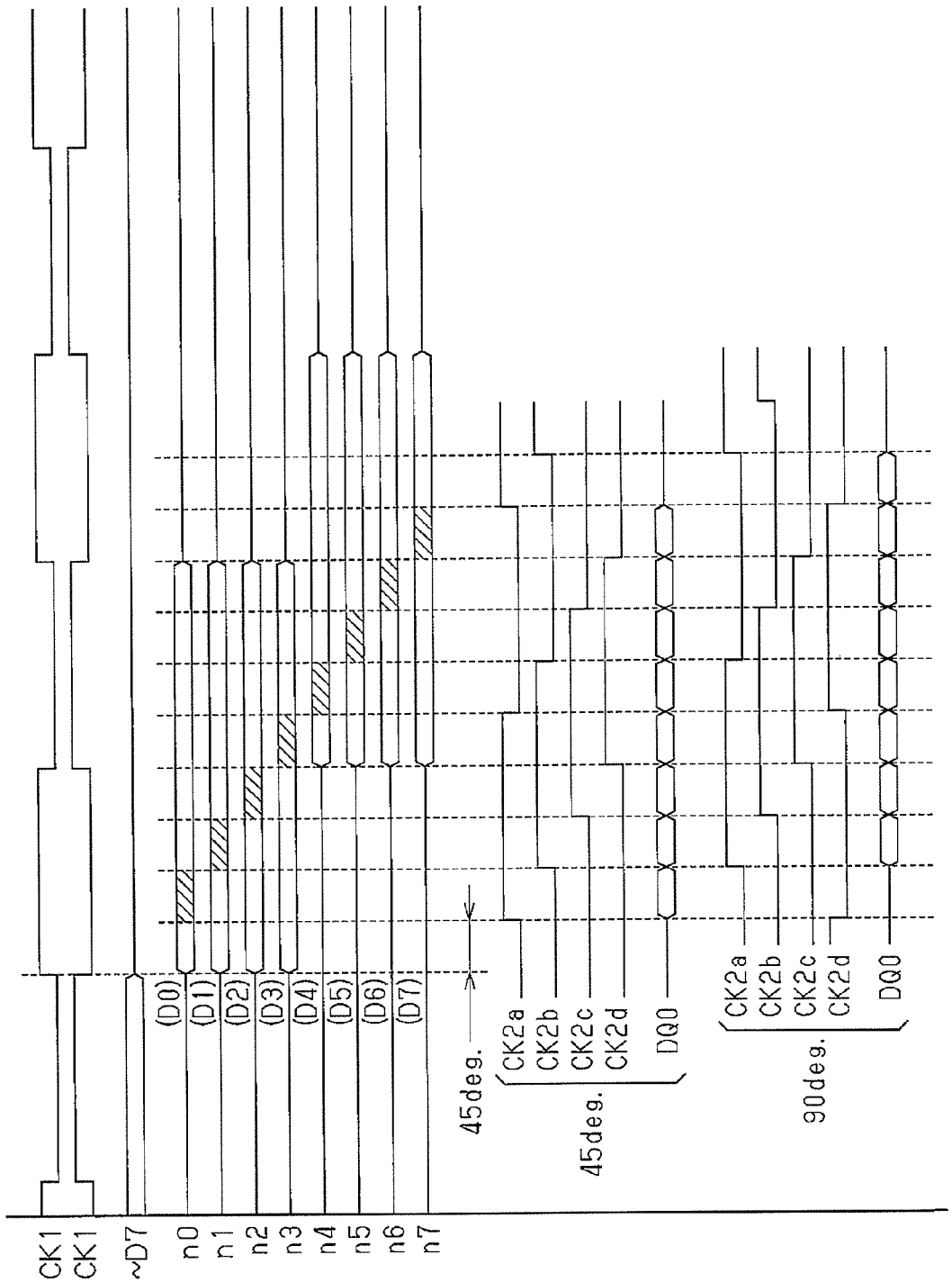
FIGS. 21 to 24 are timing diagrams for illustrating the operation of the interface circuit in FIG. 18.

As illustrated in FIG. 21, the data signals D0 to D3 are provided to the terminals n0 to n3 of the selection circuit 620 at a phase difference of 0 deg. with respect to the clock signal CK1, respectively. Additionally, the data signals D4 to D7 are provided to the terminals n4 to n7 of the selection circuit 620 at a phase difference of 180 deg. with respect to the clock signal CK1, respectively.

Hatching portions in the respective signals provided to the terminals n0 to n7 denote periods selected by the logical levels of the clock signals CK2a to CK2d, in a case where the phase difference between the clock signal CK1 and the clock signal CK2a is 45 deg. The terminals n0 to n7 are serially selected in accordance with the logical levels of the clock signals CK2a to CK2d, and the data signals D0 to D7 are output as the data signals SD0.

As illustrated in FIG. 20A, in a case where the desired phase with respect to the data signals SD0 is "90 deg. to 135 deg.", control signals whose logical values are "01" are provided to the selection circuits SC0 to SC7. The selection circuits SC0 to SC7 output the signals S0c to S7c equal to the data signals D7 (D7a) and D0 (D0a) to D6 (D6a), respectively. Then, as illustrated in FIG. 20B, control signals are provided to the selection circuits SA0 to SA7 and SB0 to SB7.

Figure 22:
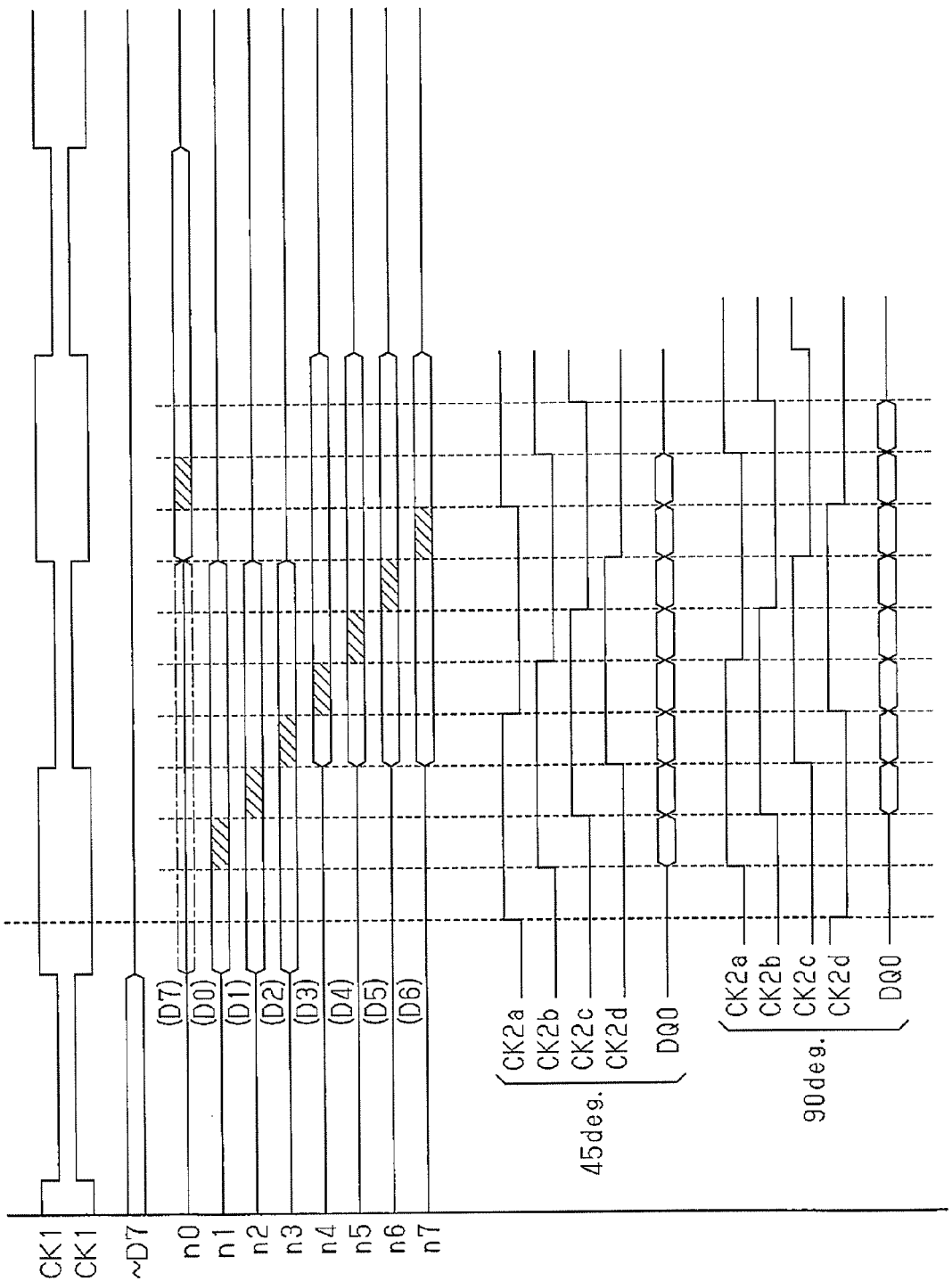

As illustrated in FIG. 22, the data signals D0 to D2 are provided to the terminals n1 to n3 of the selection circuit 620 at a phase difference of 0 deg. with respect to the clock signal CK1, respectively. Additionally, the data signals D3 to D6 are provided to the terminals n4 to n7 of the selection circuit 620 at a phase difference of 180 deg. with respect to the clock signal CK1, respectively. Then, the data signal D7 is provided to the terminal n0 of the selection circuit 620 at a phase difference of 360 deg.

Hatching portions in the respective signals provided to the terminals n0 to n7 denote periods selected by the logical levels of the clock signals CK2a to CK2d, in a case where the phase difference between the clock signal CK1 and the clock signal CK2a is 45 deg. The terminals n1 to n7 and n0 are serially selected in accordance with the logical levels of the clock signals CK2a to CK2d, and the data signals D0 to D7 are output as the data signals SD0.

As illustrated in FIG. 20A, in a case where the desired phase with respect to the data signals SD0 is "135 deg. to 180 deg.", control signals whose logical values are "10" are provided to the selection circuits SC0 to SC7. The selection circuits SC0 to SC7 output the signals S0c to S7c equal to the data signals D6 (D6a), D7 (D7a) and D0 (D0a) to D5 (D5a), respectively. Then, as illustrated in FIG. 20B, control signals are provided to the selection circuits SA0 to SA7 and SB0 to SB7.

Figure 23:
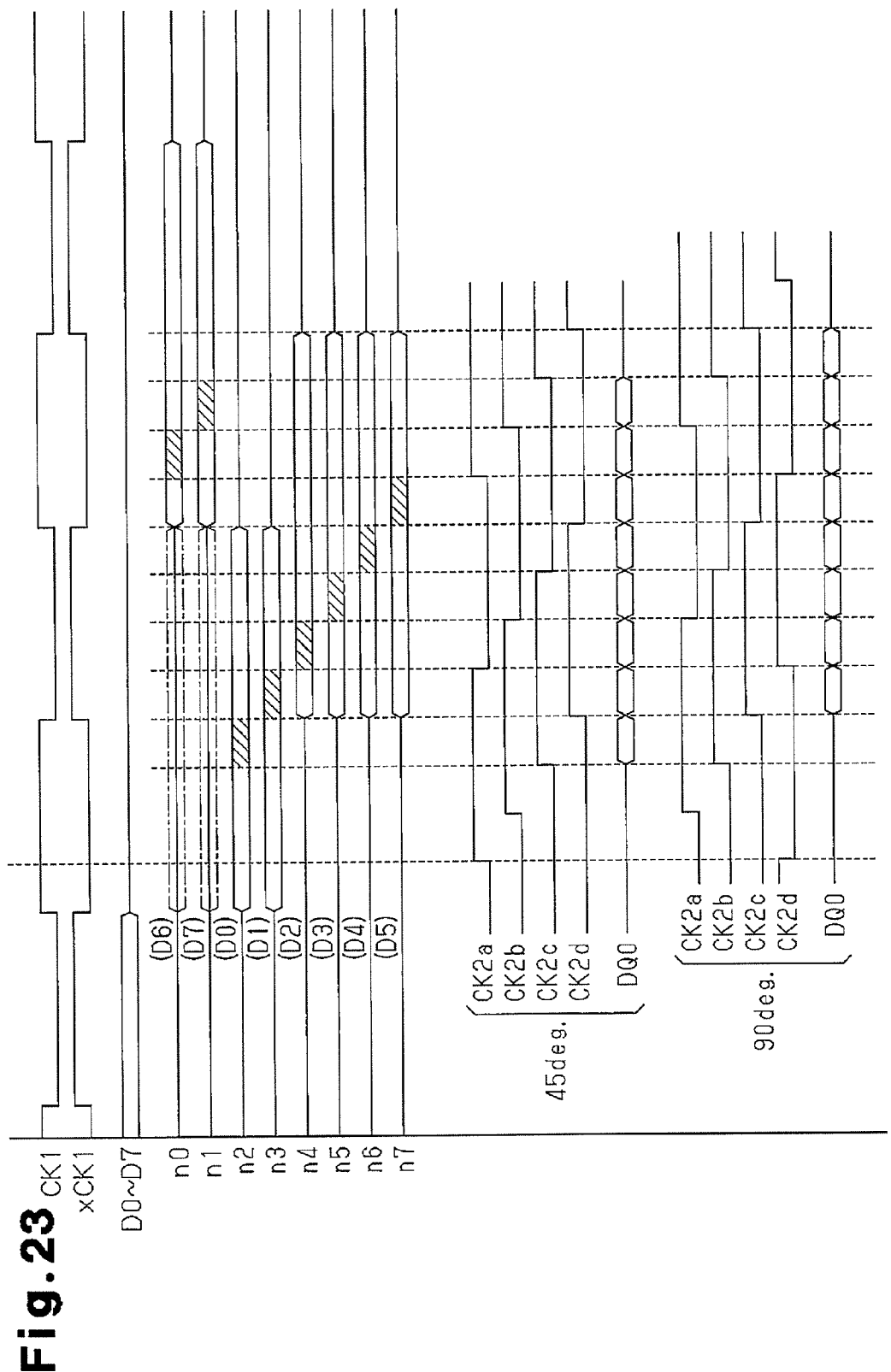

As illustrated in FIG. 23, the data signals D0 and D1 are provided to the terminals n2 and n3 of the selection circuit 620 at a phase difference of 0 deg. with respect to the clock signal CK1, respectively. Additionally, the data signals D2 to D5 are provided to the terminals n4 to n7 of the selection circuit 620 at a phase difference of 180 deg. with respect to the clock signal CK1, respectively. Then, the data signals D6 and D7 are provided to the terminals n0 and n1 of the selection circuit 620 at a phase difference of 360 deg.

Hatching portions in the respective signals provided to the terminals n0 to n7 denote periods selected by the logical levels of the clock signals CK2a to CK2d, in a case where the phase difference between the clock signal CK1 and the clock signal CK2a is 45 deg. The terminals n2 to n7, n0 and n1 are serially selected in accordance with the logical levels of the clock signals CK2a to CK2d, and the data signals D0 to D7 are output as the data signals SD0.

As illustrated in FIG. 20A, in a case where the desired phase with respect to the data signals SD0 is "180 deg. to 225 deg.", control signals whose logical values are "11" are provided to the selection circuits SC0 to SC7. The selection circuits SC0 to SC7 output the signals S0c to S7c equal to the data signals D5 (D5a) to D7 (D7a) and D0 (D0a) to D4 (D4a), respectively. Then, as illustrated in FIG. 20B, control signals are provided to the selection circuits SA0 to SA7 and SB0 to SB7.

Figure 24:
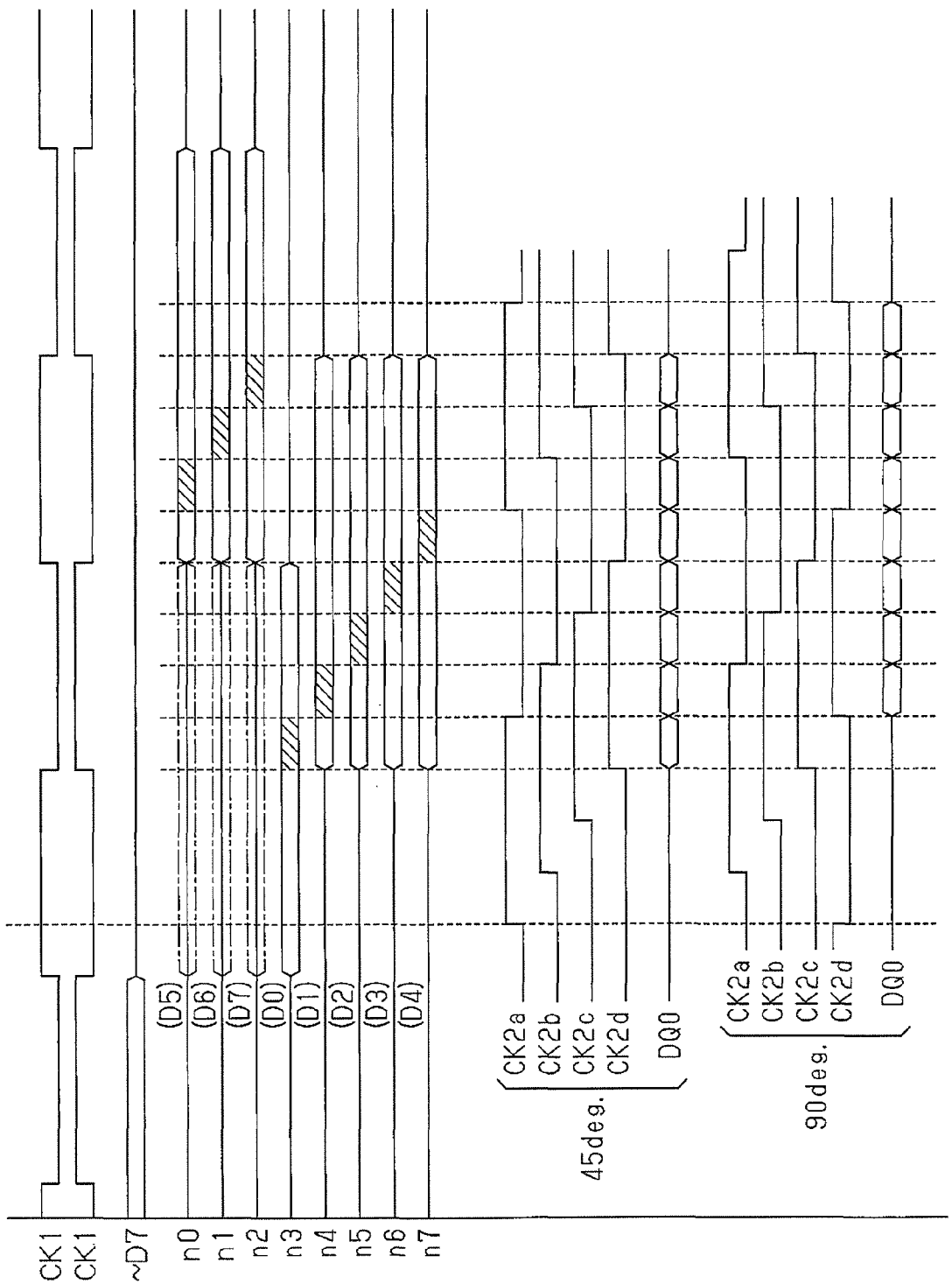

As illustrated in FIG. 24, the data signal D0 is provided to the terminal n3 of the selection circuit 620 at a phase difference of 0 deg. with respect to the clock signal CK1. Additionally, the data signals D1 to D4 are provided to the terminals n4 to n7 of the selection circuit 620 at a phase difference of 180 deg. with respect to the clock signal CK1, respectively. Then, the data signals D5 to D7 are provided to the terminals n0 to n2 of the selection circuit 620 at a phase difference of 360 deg., respectively.

Hatching portions in the respective signals provided to the terminals n0 to n7 denote periods selected by the logical levels of the clock signals CK2a to CK2d, in a case where the phase difference between the clock signal CK1 and the clock signal CK2a is 45 deg. The terminals n3 to n7 and n0 to n2 are serially selected in accordance with the logical levels of the clock signals CK2a to CK2d, and the data signals D0 to D7 are output as the data signals SD0.

As described above, according to the third embodiment, the following effects are produced.

(3-1) The conversion circuit 340 that converts the 8-bit data signals D0 to D7 into the eight 1-bit data signals SD0 may easily adjust the output timing of the data signals SD0. Additionally, even when the phase adjustment range of the clock signal CK2a in the delay locked loop circuit 601 is not widened, the output timing of the data signals SD0 may be adjusted in a wide range.

It should be apparent to those skilled in the art that the present invention may be embodied in many other specific forms without departing from the spirit or scope of the invention. Particularly, it should be understood that the present invention may be embodied in the following forms.

In the first embodiment illustrated in FIG. 2, the control signals CS0 and CI0 generated by the one control code generation circuit (e.g., control code generation circuit 400) may be provided to the timing adjustment circuits 410 to 413, and the conversion circuits 420 to 423 in the respective parallel-serial conversion circuits 310 to 303. The number of the control code generation circuits may be appropriately changed. The second and third embodiments may be changed in the similar manner.

As illustrated in FIG. 13, in the second embodiment, the control signals for the selection circuits SB0 to SB3 are the same in each of the desired phase ranges. Therefore, the selection circuits SB0 to SB3, and the flip-flop circuits 530 and 531 illustrated in FIG. 11 may be omitted. Also in the third embodiment illustrated in FIG. 19, the selection circuits and the flip-flop circuits may be omitted similarly.

The number of bits of the parallel data may be appropriately changed in each embodiment.

In the first embodiment, the phase adjustment ranges of the clock signals CK2a and CK2b with respect to the clock signal CK1 are 45 (deg.) to 405 (deg.). However as long as latch circuit 500 may output the data signals SD0 according to the latched signal, the phase adjustment range may be appropriately changed to, for example, 40 (deg.) to 400 (deg.), 50 (deg.) to 410 (deg.), or the like. Also in the second and third embodiments, the phase adjustment range may be changed similarly.

In the each embodiment, the memory controller 22 that executes training operation for adjusting the output timing of the data signal DQ, and the like is used. However, a memory controller that does not have a function of executing the training operation may be used. In this case, phase information is set to the control code generation circuit, by, for example, the core circuit 21 illustrated in FIG. 1, or the like.

In each embodiment, the memory controller 22 executes training operation. However, other circuit, for example, the core circuit 21 may execute the training operation.

In each embodiment, the control device 11 including the interface circuit 23 is described. However, the aforementioned interface circuit may be applied to a circuit that receives the data signal DQ and the data strobe signal DQS, for example, an SDRAM, or a memory controller.

In each embodiment, the interface circuit 23 that outputs data to the memory device 12 is described. However, an output circuit that outputs a signal to a circuit other than a memory, for example, an output circuit for communication may be employed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although embodiments of the present invention have been described in detail, it should be understood that various changes, substitutions, and alterations could be made hereto without departing from the spirit and scope of the invention.

What is claimed is:

1. A parallel-serial conversion circuit comprising:
an adjustment circuit that receives a parallel input signal having a plurality of bits and generates and outputs a parallel output signal having a plurality of bits; and
a conversion circuit coupled to the adjustment circuit, wherein the conversion circuit generates a plurality of clock signals having mutually different phases with respect to a reference clock signal on the basis of the reference clock signal and serially selects the plurality of bits of the parallel output signal in accordance with the generated plurality of clock signals to convert the parallel output signal to serial 1-bit output signals,
wherein the adjustment circuit adjusts the output timing of each of the plurality of bits of the parallel output signal in time unit of half of one cycle of the reference clock signal.

2. The parallel-serial conversion circuit according to claim 1, wherein the conversion circuit includes:
a plurality of delay locked loop circuits configured to output the plurality of clock signals, and
a selection circuit coupled to the plurality of delay locked loop circuits and configured to serially select the plurality of bits of the parallel output signal in accordance with the plurality of clock signals to output the serial 1-bit output signals.

3. The parallel-serial conversion circuit according to claim 1, further comprising:
a control circuit coupled to the adjustment circuit and the conversion circuit to generate a first control signal and a second control signal in accordance with phase information, wherein
the conversion circuit is configured to control a phase difference between the reference clock signal and one of the plurality of clock signals on the basis of the second control signal, and
the adjustment circuit adjusts the output timing of the plurality of bits of the parallel output signal on the basis of the first control signal.

4. The parallel-serial conversion circuit according to claim 3, wherein the adjustment circuit includes
a latch circuit configured to latch the plurality of bits of the parallel input signal on the basis of the reference clock signal, and
a delay adjustment circuit coupled to the latch circuit and configured to delay, by a delay amount according to the first control signal, a plurality of output signals of the latch circuit corresponding to the plurality of bits of the parallel input signal from timing based on the reference clock signal, and an inverted clock signal formed by inverting the reference clock signal to generate the parallel output signal having the plurality of bits.

5. The parallel-serial conversion circuit according to claim 1, further comprising a control circuit coupled to the adjustment circuit and the conversion circuit and configured to generate a first control signal and a second control signal in accordance with phase information, wherein
the conversion circuit is configured to control a phase difference between the reference clock signal and one of the plurality of clock signals, on the basis of the second control signal, and
the adjustment circuit adjusts the output timing of the plurality of bits of the parallel output signal on the basis of the first control signal and outputs respective bits of the parallel output signal to output positions of the conversion circuit adjusted on the basis of the first control signal.

6. A parallel-serial conversion circuit comprising:
an adjustment circuit that receives a parallel input signal having $2^n$ bits and generates and outputs a parallel output signal having $2^n$ bits; and
a conversion circuit coupled to the adjustment circuit, wherein the conversion circuit generates n clock signals having mutually different phases with respect to a reference clock signal on the basis of the reference clock signal and serially selects the $2^n$ bits of the parallel output signal in accordance with the generated n clock signals to convert the parallel output signal having the $2^n$ bits to serial 1-bit output signals,
wherein
the n clock signals each have a frequency equal to a frequency of the reference clock signal,
the n clock signals each have phase differences of $\frac{1}{2^n}$ of a cycle of the reference clock signal with respect to a phase of the reference clock signal, and
the adjustment circuit adjusts the output timing of each of the $2^n$ bits of the parallel output signal in time unit of half of one cycle of the reference clock signal.

7. An interface circuit for use with a memory and a memory controller that is included in a control device and controls access to the memory, wherein the interface circuit outputs complementary clock signals, a data signal and a strobe signal in accordance with an instruction from the memory controller, the interface circuit comprising:
a parallel-serial conversion circuit, the parallel-serial conversion circuit including:
an adjustment circuit that receives a parallel input signal having a plurality of bits and generates and outputs a parallel output signal having a plurality of bits; and
a conversion circuit coupled to the adjustment circuit, wherein the conversion circuit generates a plurality of clock signals having mutually different phases with respect to a reference clock signal on the basis of the reference clock signal and phase information that is set by the memory controller according to a clock skew output from the memory according to the complementary clock signals and the strobe signal and serially selects the plurality of bits of the parallel output signal in accordance with the generated plurality of clock signals to convert the parallel output signal having the plurality of bits to serial 1-bit output signals, and
the adjustment circuit is configured to adjust the output timing of each of the plurality of bits of the parallel output signal in time unit of half of one cycle of the reference clock signal.

8. A control device for use with a memory, comprising:
a memory controller that controls access to the memory; and
an interface circuit coupled to the memory controller to output a clock signal, a data signal, and a strobe signal in accordance with an instruction from the memory controller, wherein
the memory is configured to output a clock skew between the clock signal and the strobe signal,
the memory controller sets phase information based on the clock skew to the interface circuit,
the interface circuit includes a parallel-serial conversion circuit, the parallel-serial conversion circuit including:
an adjustment circuit that receives a parallel input signal having a plurality of bits and generates and outputs a parallel output signal having a plurality of bits; and
a conversion circuit coupled to the adjustment circuit, wherein the conversion circuit generates a plurality of clock signals having mutually different phases with respect to a reference clock signal on the basis of the phase information and the reference clock signal and serially selects the plurality of bits of the parallel output signal in accordance with the generated plurality of clock signals to convert the parallel output signal having the plurality of bits to serial 1-bit output signals, and
the adjustment circuit adjusts the output timing of each of the plurality of bits of the parallel output signal in time unit of half of one cycle of the reference clock signal.

* * * * *